US010594262B2

(12) United States Patent
Modi et al.

(10) Patent No.: US 10,594,262 B2
(45) Date of Patent: Mar. 17, 2020

(54) APPARATUS AND METHOD OF REDUCING POWER CONSUMPTION IN A LOW INTERMEDIATE FREQUENCY RADIO RECEIVER

(71) Applicant: Short Circuit Technologies LLC, Rochester, NY (US)

(72) Inventors: Sankalp Modi, Acton, MA (US); Oren E. Eliezer, Plano, TX (US)

(73) Assignee: Short Circuit Technologies LLC, Rochester, NY (US)

( * ) Notice: Subject to any disclaimer, the term of this patent is extended or adjusted under 35 U.S.C. 154(b) by 226 days.

(21) Appl. No.: 15/650,910

(22) Filed: Jul. 16, 2017

(65) Prior Publication Data

US 2019/0020310 A1    Jan. 17, 2019

(51) Int. Cl.
*H03D 3/00* (2006.01)
*H04L 27/26* (2006.01)
(Continued)

(52) U.S. Cl.
CPC .............. *H03D 3/009* (2013.01); *H03D 7/165* (2013.01); *H04B 1/0028* (2013.01); *H04B 1/30* (2013.01);
(Continued)

(58) Field of Classification Search
CPC ........ H03D 3/009; H03D 3/007; H03D 7/166; H03D 7/165
See application file for complete search history.

(56) References Cited

U.S. PATENT DOCUMENTS 6,892,060 B2 * 5/2005 Zheng .................... H03D 3/009
375/346
7,139,540 B2 * 11/2006 Wu ..................... H03H 11/1291
455/251.1
(Continued)

OTHER PUBLICATIONS

J. S. Syu, C. C. Meng, Y. H. Teng and H. Y. Liao, "Large Improvement in Image Rejection of Double-Quadrature Dual-Conversion Low-IF Architectures," IEEE Transactions on Microwave Theory and Techniques, vol. 58, No. 7, pp. 1703-1712, Jul. 2010.
(Continued)

*Primary Examiner* — Raj Jain
(74) *Attorney, Agent, or Firm* — Zaretsky Group PC; Howard Zaretsky

(57) ABSTRACT

A novel and useful apparatus and method for an image-interferer aware single quadrature RF downconversion (SQRD) low intermediate frequency (LIF) receiver and related power reduction techniques utilized therein. The invention applies zero-margin adaptive transceiver (ZMAT) design principles to considerably reduce the receiver's power consumption in an adaptive fashion in accordance with the instantaneous reception conditions. In a low IF dual-branch (i.e. quadrature) downconversion receiver, the radio monitors the image strength and shuts off the receiver's Q branch (or I branch) when image rejection is not needed (i.e. when the relative image strength is below a threshold), thus significantly reducing power consumption in the RF receiver. A zero IF receiver is switched to a SQRD low IF receiver of lower power consumption when the image interferer strength is low enough to allow for a given required level of performance.

17 Claims, 17 Drawing Sheets

(51) Int. Cl.
    *H03D 7/16*         (2006.01)
    *H04W 52/02*      (2009.01)
    *H04B 1/00*        (2006.01)
    *H04B 1/30*        (2006.01)
    *H04L 5/00*        (2006.01)
    *H04B 1/10*        (2006.01)

(52) U.S. Cl.
    CPC .. *H04L 27/2647* (2013.01); *H03D 2200/0084* (2013.01); *H03D 2200/0088* (2013.01); *H04B 1/109* (2013.01); *H04L 5/0007* (2013.01); *H04W 52/0203* (2013.01)

(56) References Cited

U.S. PATENT DOCUMENTS

| | | | | |
|---|---|---|---|---|
| 7,627,295 | B2* | 12/2009 | Takahiko | H03D 3/007 375/324 |
| 2004/0131127 | A1* | 7/2004 | Nadiri | H04B 1/40 375/271 |
| 2006/0063504 | A1* | 3/2006 | Bergervoet | H03D 7/00 455/293 |
| 2019/0020310 | A1* | 1/2019 | Modi | H03D 3/009 |

OTHER PUBLICATIONS

R. Senguttuvan, S. Sen and A. Chatterjee, "VIZOR: Virtually Zero Margin Adaptive RF for Ultra Low Power Wireless Communication," 25th International Conference on Computer Design, pp. 580-586, 2007.

S. Sen, V. Natarajan, R. Senguttuvan and A. Chatterjee, "Pro-VIZOR: Process Tunable Virtually Zero Margin Low Power Adaptive RF for Wireless Systems," 45th ACM/IEEE Design Automation Conference, pp. 492-497, 2008.

S. Sen, V. Natarajan, S. Devarakond and A. Chatterjee, "Process-Variation Tolerant Channel-Adaptive Virtually Zero-Margin Low-Power Wireless Receiver Systems," IEEE Transactions on Computer-Aided Design of Integrated Circuits and Systems, vol. 33, issue 12, pp. 1764-1777, Dec. 2014.

* cited by examiner

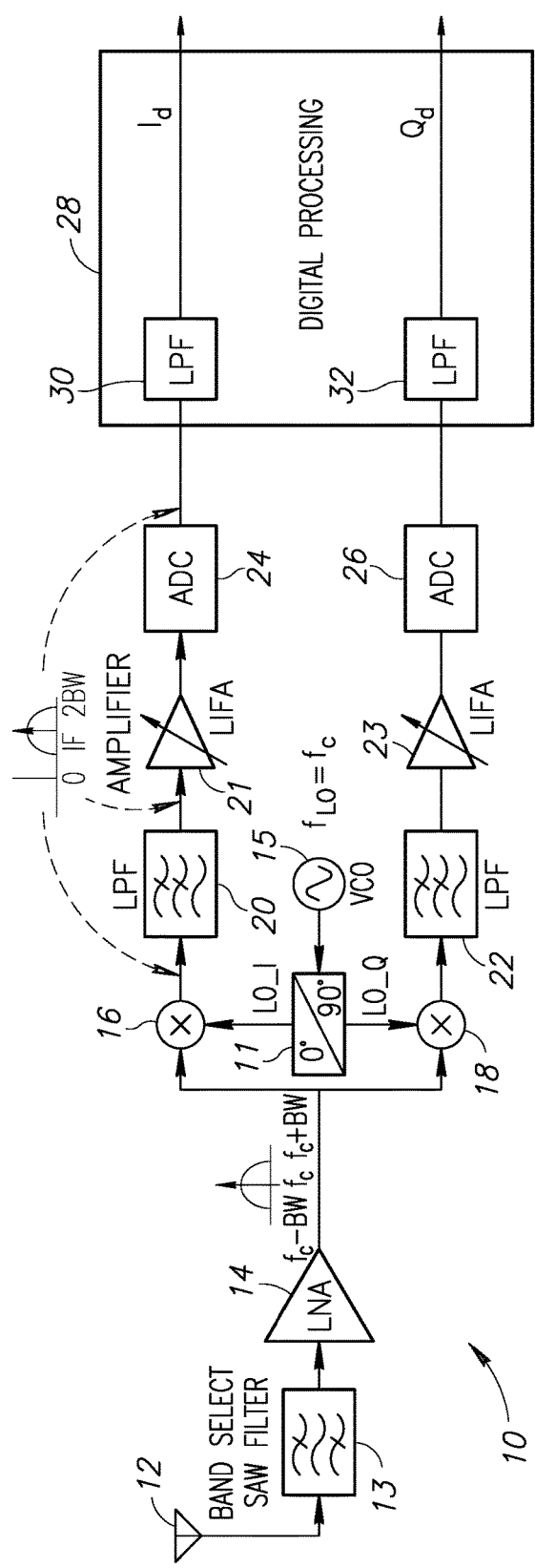
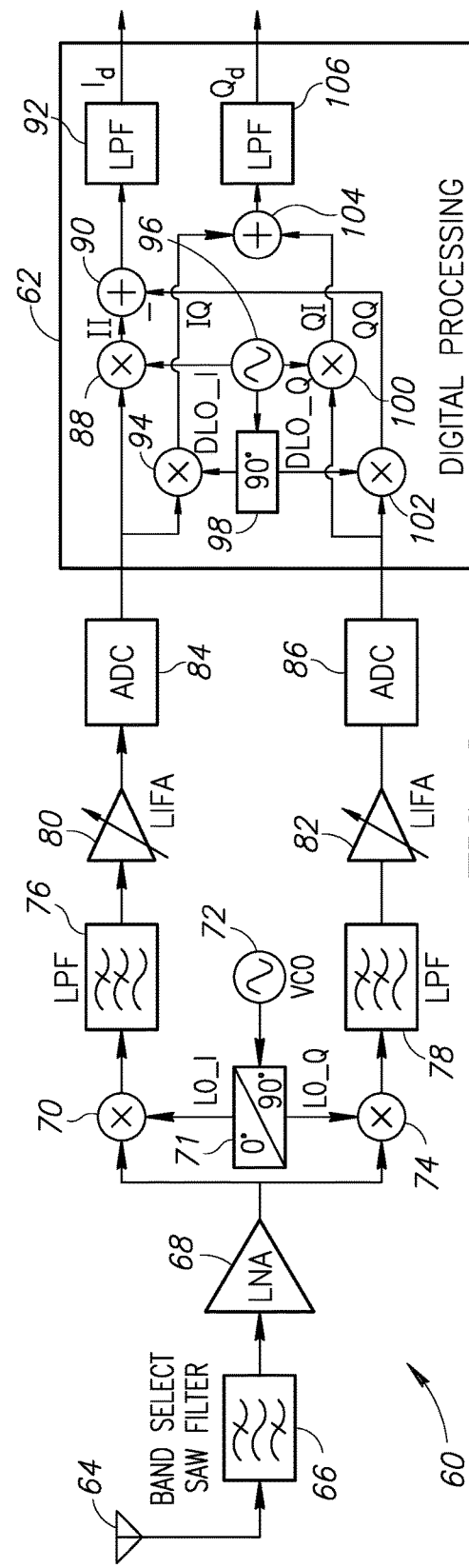
FIG. 2
FIG. 3

APPARATUS AND METHOD OF REDUCING POWER CONSUMPTION IN A LOW INTERMEDIATE FREQUENCY RADIO RECEIVER

FIELD OF THE INVENTION

The present invention relates generally to radio frequency (RF) communication circuits and in particular to an apparatus and method for an image aware single-branch quadrature RF downconversion (SQRD) low intermediate frequency (LIF) receiver and power reduction techniques utilized therein.

BACKGROUND OF THE INVENTION

In the current competitive market of consumer wireless mobile devices, power consumption and battery life are considered some of the most crucial factors for the product. Consequently, there has been extensive research on the subject of power reduction of wireless transceivers and it is currently a very active area of research. One of the recently explored concepts in this field is the zero-margin adaptive transceiver (ZMAT) paradigm. Typically, radio receivers are designed to meet the specifications of a particular wireless standard for the worst case wireless channel conditions. During use of the transceiver, however, most of the time the condition of the wireless channel is much better than the worst-case conditions. The ZMAT concept exploits such better channel conditions to save power, i.e. reduce the current consumption of one or more receiver components such as the low noise amplifier (LNA), mixer, filters, analog to digital converter (ADC), etc.

One of the dominating factors in characterizing the condition of the wireless channel is the signal to interference ratio (SIR). A low-IF (LIF) receiver is particularly affected by the interference at the image frequency, also referred to as the image signal. Typically, LIF receivers are designed with relatively high image rejection ratios (IRR) of approximately 40 to 60 dB. The required IRR is calculated according to the maximum tolerable image strength for the target wireless standard. The image strength, however, can vary over time and location and thus so does the IRR requirement.

There is thus a need for a radio receiver that extends the ZMAT concept to the rejection of image signals by providing image interference awareness. Such a radio receiver should identify and opportunistically exploit scenarios of very low image signal strength to significantly reduce power consumption of the radio receiver.

SUMMARY OF THE INVENTION

The present invention is an apparatus and method for an image aware single-branch quadrature RF downconversion (SQRD) low intermediate frequency (LIF) receiver and related power reduction techniques utilized in the receiver. The invention takes advantage of ZMAT design principles and extends them to provide a receiver that can reduce power consumption considerably.

In a low IF dual downconversion receiver constructed in accordance with the present invention, the radio monitors the image strength and shuts off the Q branch when image rejection is not needed (i.e. the image strength is below a threshold). This significantly reduces the power consumption of a number of components in the receiver including: (1) the local RF oscillator circuitry because it would not need to produce two signals at exactly 90-degree phase-shift and also drive two RF mixers; (2) the RF mixer and subsequent low pass analog filter, since only one RF mixer and filter are required instead of two; and (3) the analog to digital converter (ADC) function, since only one ADC is required instead of two. In accordance with the method of the present invention, a zero IF receiver is switched to a SQRD low IF receiver to save power when the image strength is found to be sufficiently low.

The zero-margin adaptive transceiver (ZMAT) paradigm applied in the present invention adapts the receiver functionality according to the channel conditions without intolerably affecting the bit error rate (BER). The basic paradigm is to reduce power consumption by removing any unnecessary margins during good channel conditions.

Typically, a low IF (LIF) receiver is designed to withstand a relatively high level of image signal interference. The strength of the image signal (i.e. $P_{im}$), however, like any other interference signal, typically varies with time. It may be that most of the time the image strength is significantly lower than the maximum tolerable image strength. In such cases, the channel conditions in terms of image interference are generally better than the assumed worst case for which the receivers are typically designed; and thus, present an opportunity to apply the ZMAT principle in this context.

The present invention thus preferably operates in scenarios where the image signal strength ($P_{im-Low}$) is very low. In a very low image strength scenario, the reduced image rejection requirements are leveraged to provide significant power savings. In addition, the image strength is detected to make the receiver 'image aware'.

The receiver of the present invention can be incorporated within a wide range of circuit applications and is especially suitable for use in low power wireless applications such as battery powered or battery-less mobile devices, internet-of-things (IoT) devices powered by batteries or by environment energy harvesting, etc.

There is thus provided in accordance with the invention, a method of reducing power consumption in a double quadrature RF downconversion (DQRD) low intermediate frequency (LIF) radio receiver, the method comprising operating the radio receiver in double quadrature RF downconversion (DQRD) mode, detecting a level of image interference strength in the radio receiver, switching the receiver to single quadrature RF downconversion (SQRD) operation mode when the level of image interference strength falls below a predetermined level, and switching the radio receiver back to DQRD operation mode when the level of image interference strength rises above the predetermined level.

There is also provided in accordance with the invention, a method of reducing power consumption in a double quadrature RF downconversion (DQRD) low intermediate frequency (LIF) radio receiver, the method comprising operating the radio receiver in double quadrature RF downconversion (DQRD) mode, periodically switching the radio receiver to single quadrature RF downconversion (SQRD) operation mode, detecting whether reception of the radio receiver is acceptable or not, continuing to operate the radio receiver in SQRD mode if radio reception is acceptable, and switching the radio receiver back to DQRD operation mode if radio reception is not acceptable.

There is further provided in accordance with the invention, a double quadrature RF downconversion (DQRD) radio receiver having reduced power consumption, comprising an I branch circuit, a Q branch circuit, a digital processing circuit having I branch processing portion and a Q branch processing portion, detection means for detecting a level of image interference strength in the radio receiver, a control circuit operative to configure operation of the radio receiver whereby both the I branch circuit and Q branch circuit are switched on, switch at least one of the I branch and the Q branch circuit off when the level of image interference strength falls below a predetermined level, and switch at least one of the I branch and the Q branch circuit on when the level of image interference strength rises above the predetermined level.

There is also provided in accordance with the invention, a double quadrature RF downconversion (DQRD) radio receiver having reduced power consumption, comprising an I branch circuit, a Q branch circuit, a digital processing circuit having I branch processing portion and a Q branch processing portion, a control circuit operative to periodically switch the radio receiver to single quadrature RF downconversion (SQRD) operating mode, detect whether reception of the radio receiver is acceptable or not, continue to operate the radio receiver in SQRD mode if radio reception is acceptable, and switch the radio receiver to double quadrature RF downconversion (DQRD) operation mode if radio reception is not acceptable.

There is further provided in accordance with the invention, a method of reducing power consumption in a double quadrature RF downconversion (DQRD) low intermediate frequency (LIF) radio receiver in a mobile device in communication with a base station, the method comprising receiving a first notification from the base station to attempt single quadrature RF downconversion (SQRD) operation mode, determining current signal strength and checking if it is above a first threshold, if the current signal strength is above the first threshold and in response to the first notification, switching the receiver to SQRD operation mode, and continuing to operate in SQRD mode if a performance metric is above a second threshold.

There is also provided in accordance with the invention, a method of reducing power consumption in a double quadrature RF downconversion (DQRD) low intermediate frequency (LIF) radio receiver in a mobile device in communication with a base station, the method comprising operating the radio receiver in double quadrature RF downconversion (DQRD) mode, detecting a level of image interference strength and thermal noise in the radio receiver, if the detected level of image interference is below a first threshold and that of thermal noise above a second threshold, deliberately reporting a lower link quality to force the base station to boost transmit power, switching the receiver to single quadrature RF downconversion (SQRD) operation mode, and switching the radio receiver back to DQRD operation mode when the level of image interference strength rises above the first threshold.

BRIEF DESCRIPTION OF THE DRAWINGS

The invention is herein described, by way of example only, with reference to the accompanying drawings, wherein:

FIG. 2 is a high-level block diagram illustrating an example low-IF receiver;

FIG. 3 is a high-level block diagram illustrating an example double quadrature RF downconversion (DQRD) configuration of a digital dual quadrature downconversion (DDQD) low-IF receiver;

DETAILED DESCRIPTION OF THE INVENTION

Zero-IF (ZIF) Radio Receiver Architecture

Figure 1:
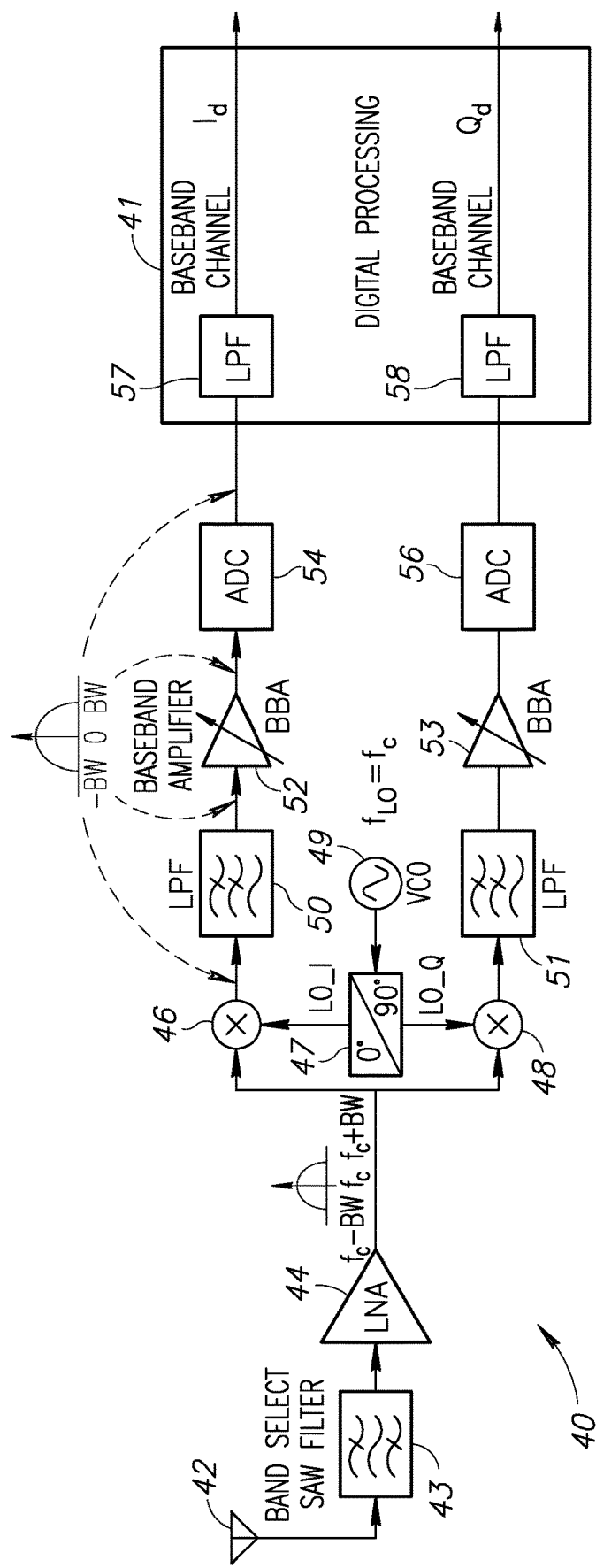
FIG. 1 is a high-level block diagram illustrating an example zero-IF receiver.

A high level schematic diagram illustrating an example zero-IF receiver is shown in FIG. 1. The zero-IF (ZIF) receiver, generally referenced 40, comprises antenna 42, band pass filter (BPF) 43, low noise amplifier (LNA) 44, voltage controlled oscillator (VCO) 49, local oscillator (LO) I/Q block 47, I branch mixer 46, low pass filter (LPF) 50, baseband amplifier (BBA) 52, analog to digital converter (ADC) 54, Q branch mixer 48, LPF 51, BBA 53, and ADC

56. Digital processing block 41 includes finite impulse response (FIR) LPF 57 that filters the I baseband signal and FIR LPF 58 that filters the Q baseband signal.

A zero-IF (ZIF) receiver, also known as a direct-conversion receiver (DCR), homodyne, or synchrodyne, is a radio receiver design that demodulates the incoming radio signal using synchronous detection driven by a local oscillator whose frequency is identical to, or very close to the carrier frequency of the intended signal. This is in contrast to the standard superheterodyne receiver where this is accomplished only after an initial conversion to an intermediate frequency (IF).

The simplification of performing only a single frequency conversion reduces the basic circuit complexity but other issues arise, such as LO leakage, and second order intermodulation in the down-converting mixer. This type of receiver design also has an additional advantage of high selectivity, and is therefore a precision demodulator. These design principles can be extended to permit separation of adjacent channel broadcast signals whose sidebands may overlap the wanted transmission. This design also improves the detection of pulse modulated signals.

Disadvantages of the ZIF receiver include the potential for signal leakage paths in the receiver where local oscillator energy leaks through the mixer stage to the antenna input and then reflects back into the mixer stage. The overall effect is that the local oscillator energy will self-mix and create a dc offset signal. The offset may be large enough to overload the baseband amplifiers and prevent receiving the wanted signal or effectively limit the dynamic range. Another disadvantage is flicker noise (i.e. 1/f noise) which exhibits an inverse frequency power density curve. Flicker noise occurs in almost all electronic devices, and it has a variety of different causes, although these are usually related to the flow of direct current.

Low-IF (LIF) Radio Receiver Architecture

A high level schematic diagram illustrating an example low-IF receiver is shown in FIG. 2. The low-IF (LIF) receiver, generally referenced 10, comprises antenna 12, BPF 13, LNA 14, VCO 15, LO I/Q block 11, I branch mixer 16, LPF 20, low-IF amplifier (LIFA) 21, ADC 24, digital processing 28, finite impulse response (FIR) LPF 30, which outputs the I baseband channel, and Q branch mixer 18, LPF 22, LIFA 23, ADC 26, digital processing 28 FIR LPF 32, which outputs the Q baseband channel.

In a LIF receiver, the RF signal is mixed down to a non-zero low or moderate intermediate frequency, typically a few megahertz (depending on the bandwidth of the signal). Low-IF receiver topologies have many of the desirable properties of zero-IF architectures, but avoid the dc offset and 1/f flicker noise problems.

The use of a non-zero IF, however, introduces an image interference issue. Modern communication systems typically require over 40 to 60 dB of image rejection, since the signal strength of an interferer at the image frequency may be significantly higher than the desired signal. This is generally addressed by one of two techniques: (1) digital dual quadrature downconversion (DDQD); and (2) image-reject mixers using polyphase filters.

Note that for consumer wireless mobile devices, LIF and ZIF architectures are preferred over superheterodyne architectures due to higher integratability and lower cost. They do not require frequency planning and hence are more suitable for multimode and multiband operations. Hence, most modern receivers in wireless mobile devices have either LIF or ZIF architectures. The main advantages of the LIF receiver over ZIF is that it does not suffer from dc offset and flicker noise. Additionally, properly choosing the IF can remove low frequency interference products that result from the downconversion of second order nonlinear demodulated AM interferers outside of the desired signal bandwidth.

A high level schematic diagram illustrating an example double quadrature RF downconversion (DQRD) configuration of a digital dual quadrature downconversion (DDQD) low-IF receiver is shown in FIG. 3. The DDQD LIF receiver, generally referenced 60, comprises antenna 64, BPF 66, LNA 68, VCO 72, LO I/Q block 71, I branch mixer 70, LPF 76, LIFA 80, ADC 84, and Q branch mixer 74, LPF 78, LIFA 82, and ADC 86. The digital processing block 62 comprises frequency source 96, LO I/Q block 98, mixers 88, 94, 100, 102 configured to generate II, IQ, QI, and QQ signals respectively. Signals II and QQ are summed to generate the I output after FIR LPF 92 and signals IQ and QI are summed to generate the Q output after FIR LPF 106.

Figure 4:
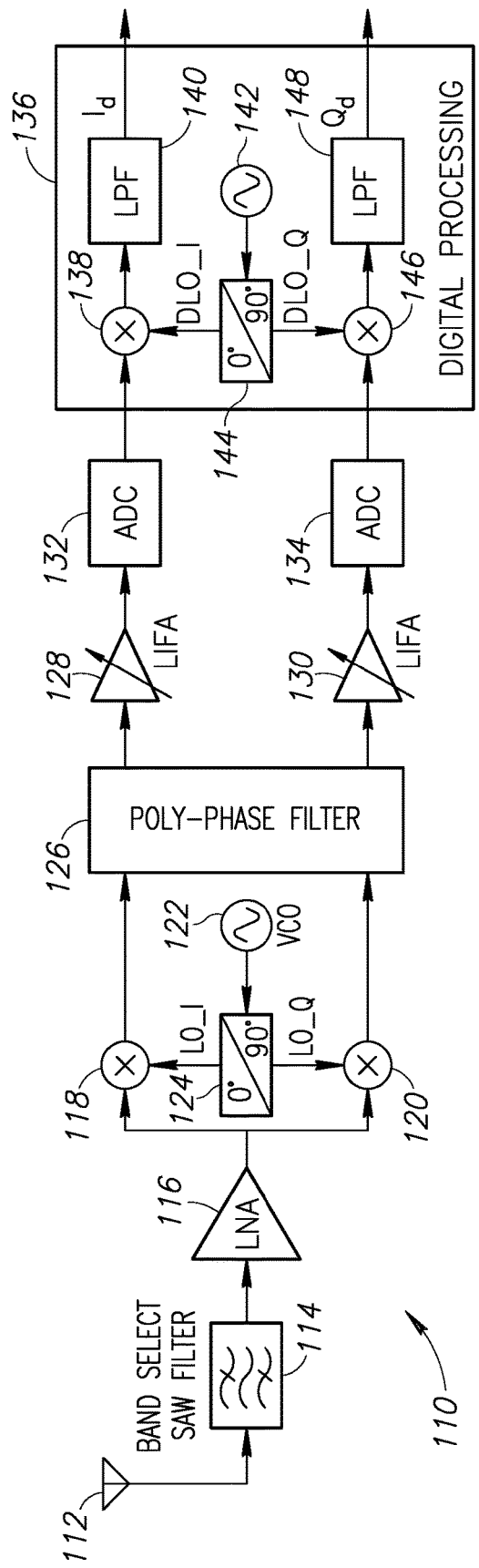
FIG. 4 is a high-level block diagram illustrating an example low-IF receiver incorporating a polyphaser filter.

A high level schematic diagram illustrating an example low-IF receiver incorporating a polyphaser filter is shown in FIG. 4. The receiver, generally referenced 110, comprises antenna 112, BPF 114, LNA 116, VCO 122, LO I/Q block 124, I branch mixer 118, polyphase filter 126, LIFA 128, ADC 132, and Q branch mixer 120, polyphase filter 126, LIFA 130, and ADC 134. The digital processing block 136 comprises frequency source 142, LO I/Q block 144, mixer 138 and FIR LPF 140 for generating the I output channel, and mixer 146 and FIR LPF 148 for generating the Q output channel.

The DDQD design requires more elaborate calibration and digital signal processing but simplifies the analog design. The polyphase approach provides a compact solution, but analog active polyphase filters are potentially power hungry. Typically, DDQD designs provide a high image rejection ratio (IRR) (e.g., over 50 dB) while the polyphase approach provides a lower rejection ratio (e.g., 40 to 45 dB). With the continuing trend towards low power digitally intensive solutions requiring high IRR, DDQD is most likely to be the preferred architecture in the future for LIF receivers. It is demonstrated infra that DDQD is the most suitable architecture to build power efficient image aware LIF radio receivers.

Upper and Lower Side Injection in DDQD-LIF Receivers

Figure 5:
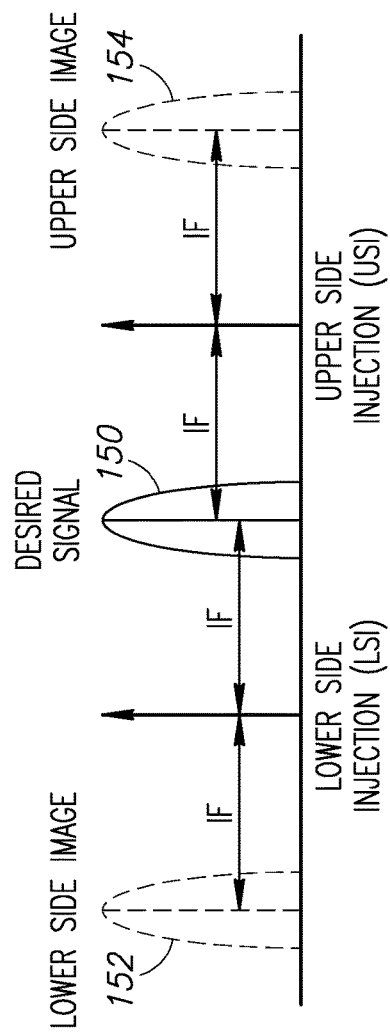
FIG. 5 is a frequency spectrum diagram illustrating upper and lower side images of an example desired signal.

In a superheterodyne or LIF receiver, either upper-side injection (USI) or lower-side injection (LSI) can be utilized for frequency conversion of the desired received signal to the receiver's intermediate frequency (IF). The term 'image channel' is used for the continuous band of frequency mirroring the location of the user channel around the carrier. As shown in FIG. 5, depending upon the selection of lower or upper side injection, the image channel will be either 2•IF above (154) or below (152) the desired channel (150) in the spectrum. The image channels corresponding to the two possible frequency conversion alternatives is referred to as upper-side image (USI) 152 and lower-side image (LSI) 152, respectively.

Figure 6:
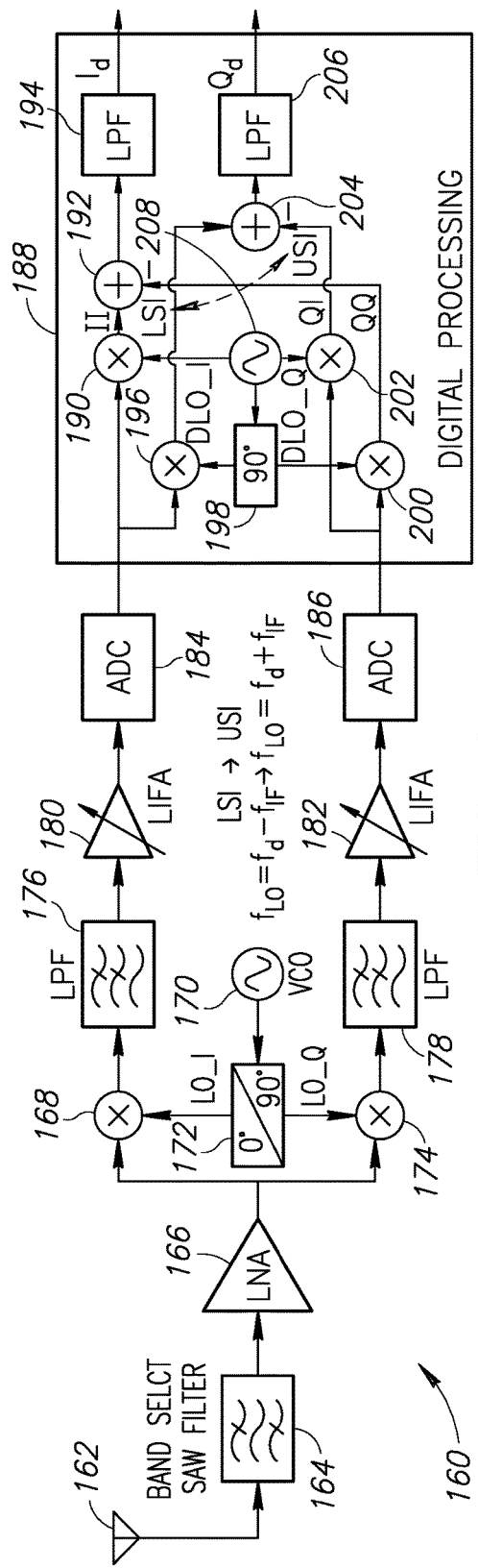
FIG. 6 is a high-level schematic diagram illustrating example reconfiguration in a digital dual quadrature downconversion (DDQD) low-IF receiver for upper-side and lower-side injection.

A high level schematic diagram illustrating example reconfiguration in a digital dual quadrature downconversion (DDQD) low-IF receiver for upper and lower side injection is shown in FIG. 6. The reconfigurable DDQD LIF receiver, generally referenced 160, comprises antenna 162, BPF 164, LNA 166, VCO 170, LO I/Q block 172, I branch mixer 168, LPF 176, LIFA 180, ADC 184, Q branch mixer 174, LPF 178, LIFA 182, ADC 186 and digital processing block 188. The digital processing block 188 comprises frequency source 208, LO I/Q block 198, mixers 190, 196, 202, and 200 configured to digitally generate II, IQ, QI, and QQ signals respectively. Signals II and QQ are summed to generate the I output after FIR LPF 194 and signals IQ and QI are summed to generate the Q output after FIR LPF 206.

In a DDQD-LIF receiver, there is little difference between upper-side and lower-side injection configurations and it is thus possible to dynamically switch between them with minor digital reconfiguration. Consequently, the DQDD-LIF architecture can provide additional flexibility in selecting either upper or lower side injection and thereby which side of the desired signal the image frequency will fall. This provides the receiver with flexibility that can be helpful in avoiding interference that may be stronger on one side versus the other, while compensating in the digital domain for the effect of spectral reversal that is experienced in upper-side injection.

Note that if lower-side injection configuration is selected, the '−' at the lower input to adder 192 is realized while the lower input to adder 204 is actually '+'. Conversely, if upper-side injection configuration is selected, the '−' at the lower input to adder 204 is realized while the lower input to adder 192 is actually '+'. This is explicitly shown in the expressions below.

For LSI, $i_d$=II−QQ; $q_d$=IQ+QI while for USI, $i_d$=II+QQ; $q_d$=IQ−QI. Thus, in the digital domain, to switch between the two configurations, only the plus sign need be switched (as denoted by the dashed arrow between the "LSI" and "USI" options in FIG. 6).

Single Quadrature RF Downconversion (SQRD)

The present invention provides an opportunity for power reduction in DDQD receiver architectures when image interference is low enough such that there is no need for the explicit image rejection mechanism. In such a case, instead of performing dual quadrature downconversion, only single quadrature downconversion in RF is required and one quadrature branch (e.g., branch Q) can be switched off.

Figure 7A:
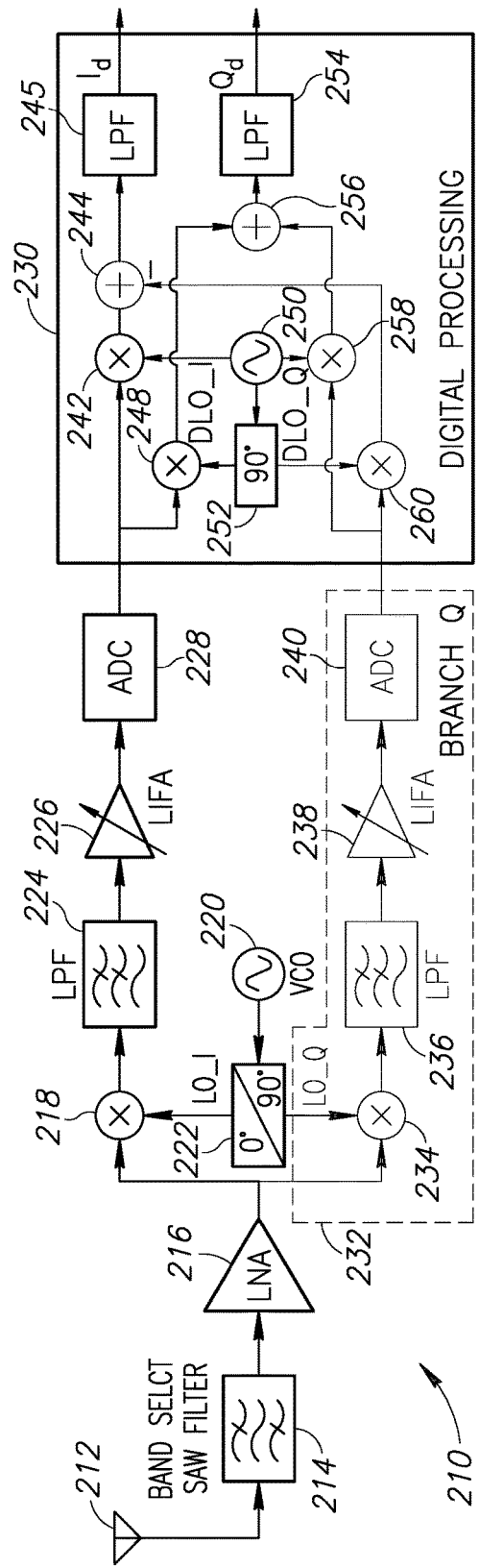
FIG. 7A is a high-level block diagram illustrating an example digital dual quadrature downconversion (DDQD) low-IF receiver constructed in accordance with the present invention.

A high level schematic diagram illustrating an example digital dual quadrature downconversion (DDQD) low-IF receiver constructed in accordance with the present invention is shown in FIG. 7A. A high level schematic diagram illustrating the example DDQD-LIF in single quadrature RF downconversion (SQRD) operation mode in accordance with the present invention is shown in FIG. 7B.

Figure 7B:
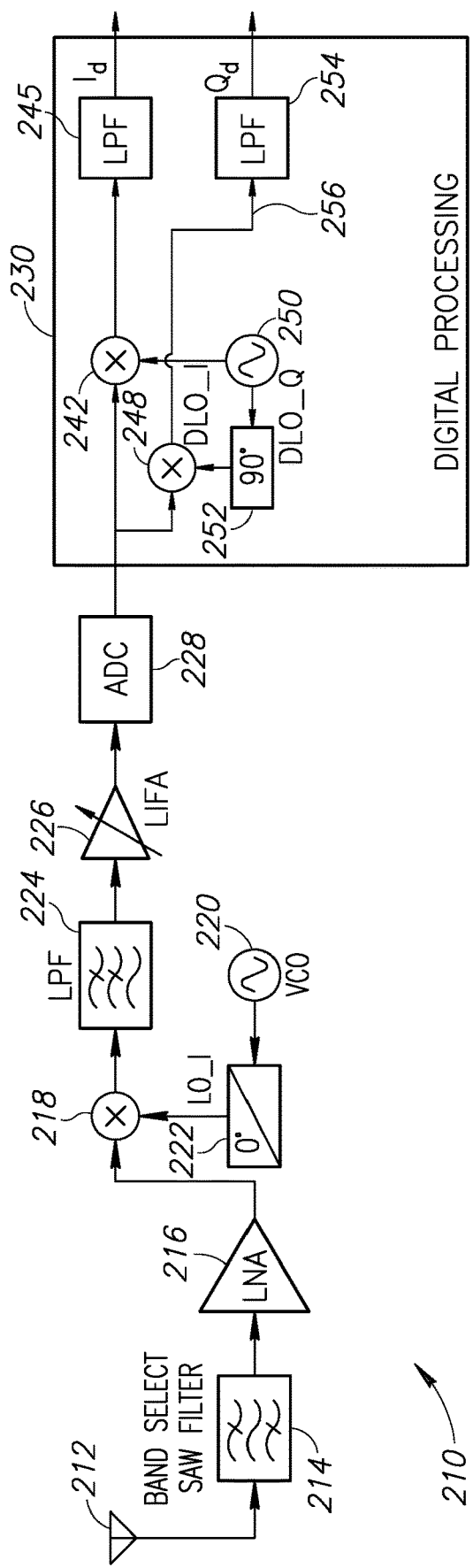
FIG. 7B is a high-level block diagram illustrating the example DDQD-LIF in single quadrature RF downconversion (SQRD) operation mode in accordance with the present invention.

The SQRD receiver of FIG. 7B, generally referenced 210, comprises antenna 212, BPF 214, LNA 216, VCO 220, LO I/Q block 222, I branch mixer 218, LPF 224, LIFA 226, and ADC 228. The digital processing block 230 comprises frequency source 250, LO I/Q block 252, mixers 242, 248, FIR LPF 245, 254, thereby representing a reduced set of active blocks when compared to the DQRD configuration of FIG. 7A.

In one embodiment of the SQRD configuration, as long as the image is below a certain fixed or adjustable threshold, the Q branch circuit 232 and corresponding processing in the digital processing section 230 are switched off. Note that I and Q data from the desired transmitted channel continue to be generated and data from neither of these branches is lost. Although the Q branch is not shown in FIG. 7B, it is understood that the hardware circuit still exists, but is powered down to reduce power consumption. Similarly, the elements within the digital baseband processing block that are not needed due to multiplication or addition by zero are not shown. These may be either hardware blocks whose operation is disabled or portions of signal processing code that are not exercised during SQRD operation.

It is appreciated by those skilled in the art that the invention is not limited to switching the Q branch off during SQRD operation. Alternatively, the I branch may be switched off instead with similar reduced power consumption benefits.

When the image becomes stronger and exceeds the threshold, the Q branch circuit 232 and associated digital processing are switched on, thereby returning to double quadrature RF downconversion (DQRD) operation, i.e. normal or regular configuration with image rejection capability (see FIG. 3). Thus, in one embodiment, the operation of the radio receiver is dynamically switched between the SQRD and DQRD modes of operation in a DDQD-LIF receiver depending upon the image strength at a given instance in time.

A brief analysis of the probability of having $P_{im}$ so low that the LIF receiver does not require any image rejection is provided infra. The analysis shows that such probability is sufficiently high to yield significant benefits, especially in the licensed bands for mobile phones. It is important to note that both I and Q data channels can still be demodulated separately in the SQRD receiver configuration because the second downconversion from IF to baseband remains a dual quadrature downconversion.

SQRD and ZIF

There exist some modern wireless standards that encode information in such a way that the spectrum around dc does not carry information in the baseband. Hence, the high flicker noise around dc can be filtered out in ZIF receivers. As the channel bandwidth increases, the spectrum efficiency lost near dc becomes insignificant and the additional ADC bandwidth requirement of LIF becomes more significant. Thus, despite its challenges due to dc offset and flicker noise, ZIF is a widely-used receiver architecture, especially for mobile broadband wireless standards. A high-level schematic of an example ZIF architecture is shown in FIG. 1 described supra.

Figure 8:
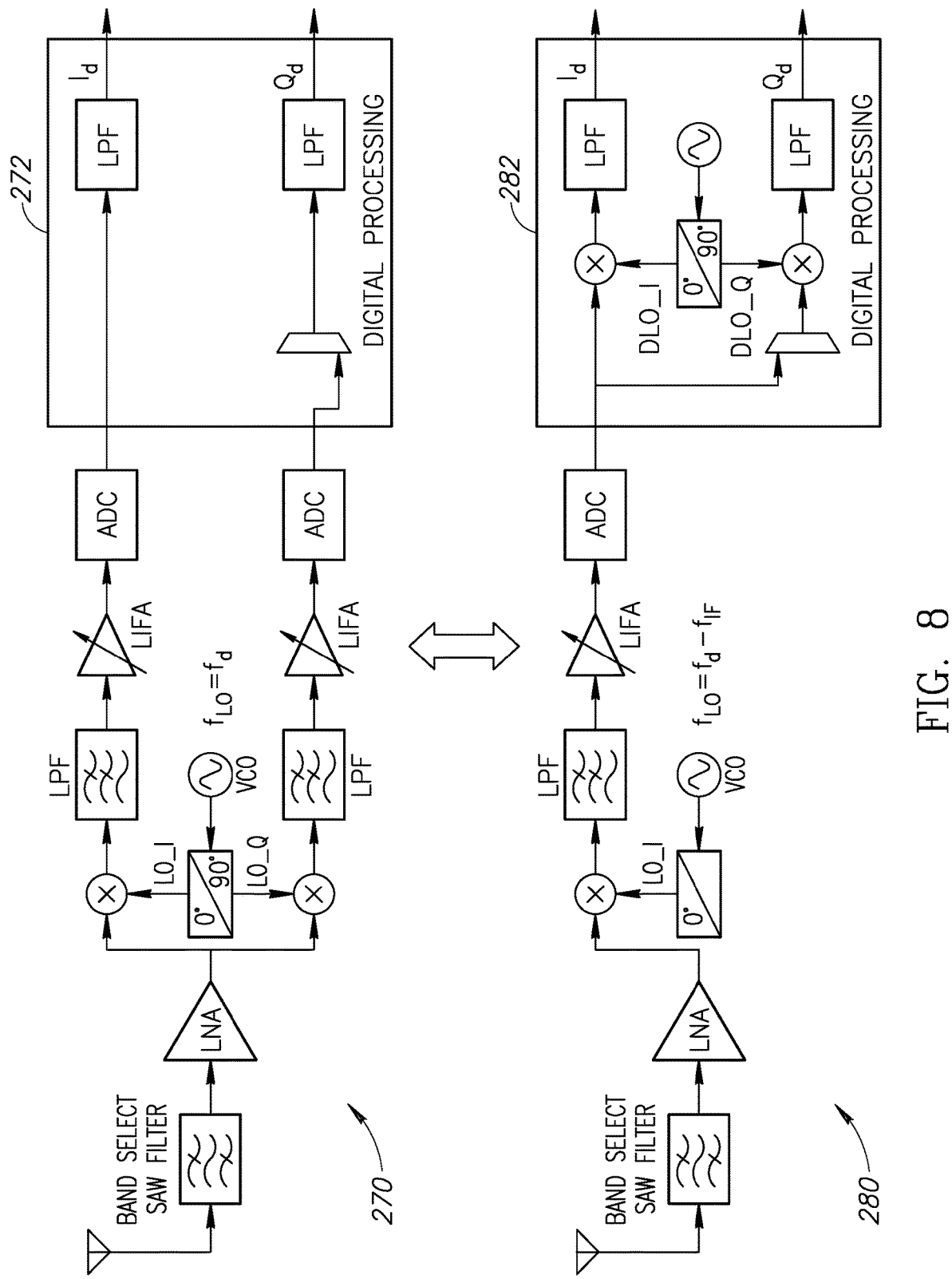
FIG. 8 is a high-level block diagram illustrating example switching between zero-IF (ZIF) receiver operation and SQRD-LIF receiver operation in accordance with the present invention.

It is noted that the ZIF (FIG. 1) and DDQD-LIF (FIG. 3) receivers have very similar RF architectures and both use double (i.e. dual-branch) quadrature downconversion at the input RF. The ZIF receiver can be reconfigured as an LIF receiver using digital reconfiguration. The LPF and baseband amplifier (BBA) in the ZIF architecture are mainly used for anti-aliasing and automatic gain control (AGC), respectively. Normally, the LPF and LIFA designed for LIF architectures can also be used for ZIF architectures. The bandwidth of the LIF ADC is higher than that of the ZIF ADC. For the delta-sigma ADCs currently in widespread use, the bandwidth can be changed dynamically by changing the sampling frequency. Consequently, as shown in FIG. 8, the present invention provides the ability to dynamically switch between ZIF and SQRD-LIF configurations depending upon the image strength in LIF configuration. This significantly broadens the application of the present invention's SQRD technique.

Note that similar to the structure shown in FIG. 7B, the portions of the system powered down or inactive during SQRD operation are not shown in the lower half portion of FIG. 8.

Power Reduction in SQRD Configuration

One advantage of the present invention is that the potential power savings when the receiver is in SQRD operation mode could be significant. Compared to the DQRD configuration, significant power is saved in the SQRD configuration by switching off one mixer, the LO buffer driving that mixer, one anti-aliasing low pass filter, one LIF amplifier and an ADC. As an example, consider a commercially available GSM/EDGE receiver manufactured by Texas Instruments. The analog portion of the receiver (including the ADC) consumes 60 mA of current and switching off branch B reduces current consumption by 20 mA. In another Texas Instruments GSM receiver product family, switching off branch B saves 14 mA of current out of 50 mA total current for the analog portion of the receiver. For Texas Instruments' WCDMA receiver, the percentage of current savings is similar. Furthermore, in the digital domain, the IQ correction block can be deactivated with the resultant elimination of two addition and two multiplication operations.

The resultant power reduction described above, represents the power reduction benefit in the SQRD configuration compared to the DQRD configuration. The average power savings correspond to the achievable power reduction multiplied by the probability of the receiver being in the SQRD operating configuration. The probability of applying the SQRD configuration is discussed infra.

Switching to SQRD-LIF from ZIF will also reduce power consumption by switching off the same circuit blocks as in LIF. Since the IF is increased, however, while switching from ZIF to SQRD-LIF, the bandwidth requirement and associated power of one ADC increases. This trade-off depends on the system implementation and channel bandwidth.

The percentage contribution of the analog receiver portion to the total power consumption (including baseband and transmitter power consumption) depends on the usage profile, the particular wireless standard and the type of the wireless device. There are several trends, however, that indicate that the power consumption of the analog portion of the receiver will remain and/or become significant. Several of these trends are discussed below.

First, while the digital baseband power consumption benefits from technology scaling and advanced power saving techniques such as variable clock speed, aggressive clock gating, and voltage scaling on finer subdivisions, the analog part of the receiver, does not benefit from technology scaling and power reduction remains much more difficult.

Second, mobile wireless usage is increasingly becoming data-centric where most of the time, mobile users are receiving data (e.g., internet web pages, multimedia files, and streaming video) and do not transmit as much data back to the base station. Consequently, the receiver in the mobile device shares an increasingly larger burden of the data traffic compared to the transmitter, and may be active at a much higher duty cycle than the transmitter.

Third, denser deployment in urban areas is required to increase network capacity, which reduces the average distance between the mobile device and the serving base station. This directly decreases the amount of transmitter power consumption while not decreasing the receiver power consumption.

Forth, the emerging wireless standards drive for lower transmission power. For example, consider the 2G GSM standard where maximum transmission signal power could be about 2 W, while for the 4G WiMax standard it is only about 0.2 W. This reduces the share of the transmitter in total power consumption.

Noise Increase Due to Absence of Image Rejection

Even when interference is not present in the image channel, thermal noise is still present in the image channel. Therefore, switching off the Q branch will remove any image rejection mechanism in use and the thermal noise in the image channel will then alias into the user channel. Thus, the SQRD configuration of the present invention suffers from doubled thermal noise after the first downconversion. Whether such an increase in thermal noise can be tolerated depends primarily on (1) the received signal strength and input signal to noise ratio (SNR), (2) whether the thermal noise is the dominating noise factor in SNR in the receiver and not in-channel interference, and (3) the required output SNR. It is noted that SNR degradation due to the noise aliasing in the SQRD technique of the present invention is usually affordable due to the following:

1. The total SNR degradation in a receiver occurs due to a number of other sources and/or mechanisms such as intermodulation and cross-modulation noise, reciprocal mixing, and quantization noise. Therefore, it would be incorrect to assume that the thermal noise folding in the SQRD always results in an additional 3 dB SNR degradation compared to DQRD. Depending upon the design of the receiver and noise budget allocation, the SNR degradation due to thermal noise aliasing may be significantly lower. In a scenario where the received signal is not near the sensitivity level of the receiver, such SNR degradation may be tolerable.

2. Many modern communication systems, such as wireless LANs, employ adaptive coding and modulation (ACM), wherein the signal bandwidth, the modulation scheme/constellation, and an accompanying coding scheme/rate are selected dynamically according to channel conditions. If there is a non-negligible SNR degradation due to thermal noise folding, such lower SNR may be acceptable with a lower order modulation scheme (i.e. decreased data rate) to save power.

3. Finally, base stations may be requested to boost the signal power to improve receiver input SNR and compensate for SNR degradation due to thermal noise aliasing.

In a frequency division duplexing (FDD) transceiver, wideband transmitter noise that leaks into the receiver may also present in the image channel, which aliases down to the IF in the user channel. The discussion supra is also applicable to wideband transmitter leakage noise.

Inter-modulation, cross-modulation noise and/or reciprocal noise can also increase when the receiver's image rejection mechanism is disabled. Unlike ever present thermal noise, however, the effect of these noise sources depends on the presence and strength of strong interference. In the worst case, when both the user and image channel are affected by the strong interference through intermodulation and/or reciprocal noise, it can significantly degrade the output SNR. According to the ZMAT paradigm described supra, however, the 'image-aware' receiver of the present invention detects noise and/or interference in the image band and the image rejection mechanism is only turned off when the SQRD configuration mode is able to provide acceptable SNR performance. If the noise increase in the SQRD operating mode is excessive due to the presence of strong interference signals, the receiver stays in DQRD configuration. Thus, inter and/or cross-modulation noise and reciprocal noise do not outrule the use of the SQRD technique, but rather merely reduce the probability of the receiver's second branch (e.g., Q branch) being switched off. Note that if the detected level of image interference is low enough to switch to SQRD operation, but thermal noise cannot be tolerated due to low signal strength, the mobile device can deliberately report lower link quality in order to force the base station transmitter to boost transmit power to enable a successful switch to SQRD operation mode.

In CDMA systems, side channel interference due to non-orthogonality may also increase when the receiver switches to the SQRD operating configuration.

Detection of Image Interference

The present invention provides several techniques for detecting image strength in a received signal: (1) network assisted detection, and (2) autonomous detection (such as in handsets). These will now be discussed below.

Network Assisted Detection

Network assisted detection is particularly suitable for the licensed bands of mobile phones. For illustration purposes only, GSM/EDGE systems, which are the most widely used mobile technology today, are used as an example. The technique presented, however, can also be applied to other types of systems.

Note that a wireless mobile system operates over a particular frequency band. A band is further divided into frequency channels according to the particular wireless standard. A single frequency channel can be shared between users using time division multiple access (TDMA), or code division multiple access (CDMA).

Keeping the Image Channel within Known Downlink Channels

Generally, it is assumed that the image interference can appear anytime and the receiver has no information about the interference. This, however, is not true for the licensed bands. Several observations for a typical mobile phone system that uses licensed bands include:

1. Low separation: In an LIF receiver, it is desirable to select the intermediate frequency (IF) that is greater than half of the channel bandwidth to avoid dc offset and flicker noise. On the other hand, it is should be kept low to reduce the ADC requirements. Typically, the IF is chosen in the range $0.5B<IF<1.5B$, where B is the desired channel bandwidth. The frequency separation S between the image signal and the desired signal is $S=2\cdot IF$, hence $B<S<3B$. Thus, the image signal and the desired signal are separated by a distance greater than the bandwidth of the signal of interest. For GSM/EDGE systems, the separation S may be in the range 200 to 600 kHz.
2. Separate uplink and downlink bands: the uplink and downlink frequency bands are usually separated by several MHz.
3. USI/LSI selection: as discussed supra, by selecting USI or LSI in the DDQD receiver we can select which side of the desired signal the image frequencies fall.
4. Typically, when a mobile phone network operator (MNO), e.g., AT&T, T-Mobile, licenses a portion of spectrum for a particular standard, that frequency allotment is continuous, and allocated spectrum contains at least ten side-by-side user channels.

From observations (1) and (2) above, it is reasonable to expect that for each downlink frequency channel of the licensed band, its image channel will also lie in that licensed downlink band. Even for the channels towards the end of the downlink spectrum, we can ensure that the image channel falls into the licensed downlink band by appropriate selection of USI/LSI (see observation (3)).

Figure 9:
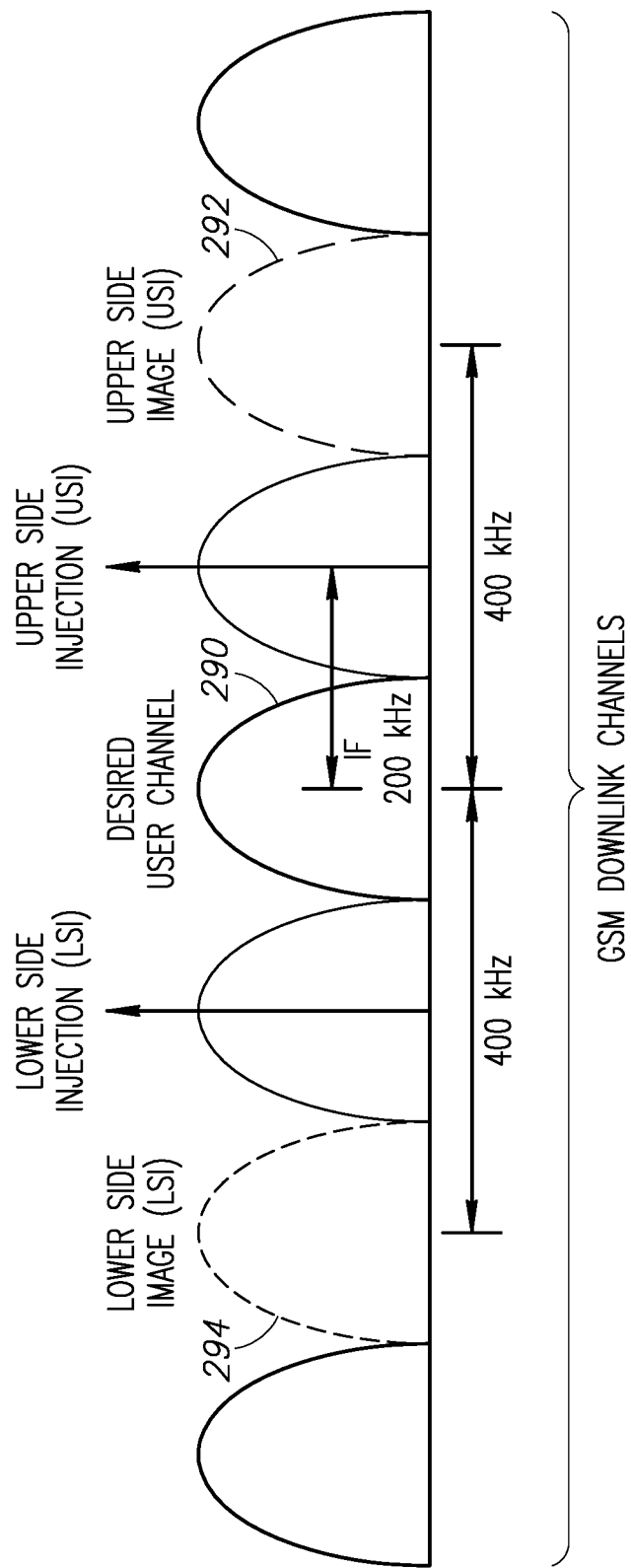
FIG. 9 is a frequency spectrum diagram illustrating upper side image (ISI)/lower side image (LSI) controlled by the same example GSM mobile phone network operator (MNO)

Furthermore, the same argument can be extended to observation (4). Since the downlink frequency owned by the MNO is known in advance, the image can be kept within the downlink frequencies owned by the same MNO by proper selection of LSI/USI. For example, if a user is served by an AT&T GSM/EGDE network and the IF is 200 kHz, then GSM downlink channels located 400 kHz above or below are the potential image interference channels. See FIG. 9, which is a diagram illustrating upper side image (ISI)/lower side image (LSI) controlled by the same example GSM mobile phone network operator (MNO). It is likely that at least one of these image channels, LSI or USI, will be owned by AT&T. Note that for the majority of the AT&T downlink channels, both USI and LSI will be owned by AT&T.

Figure 10:
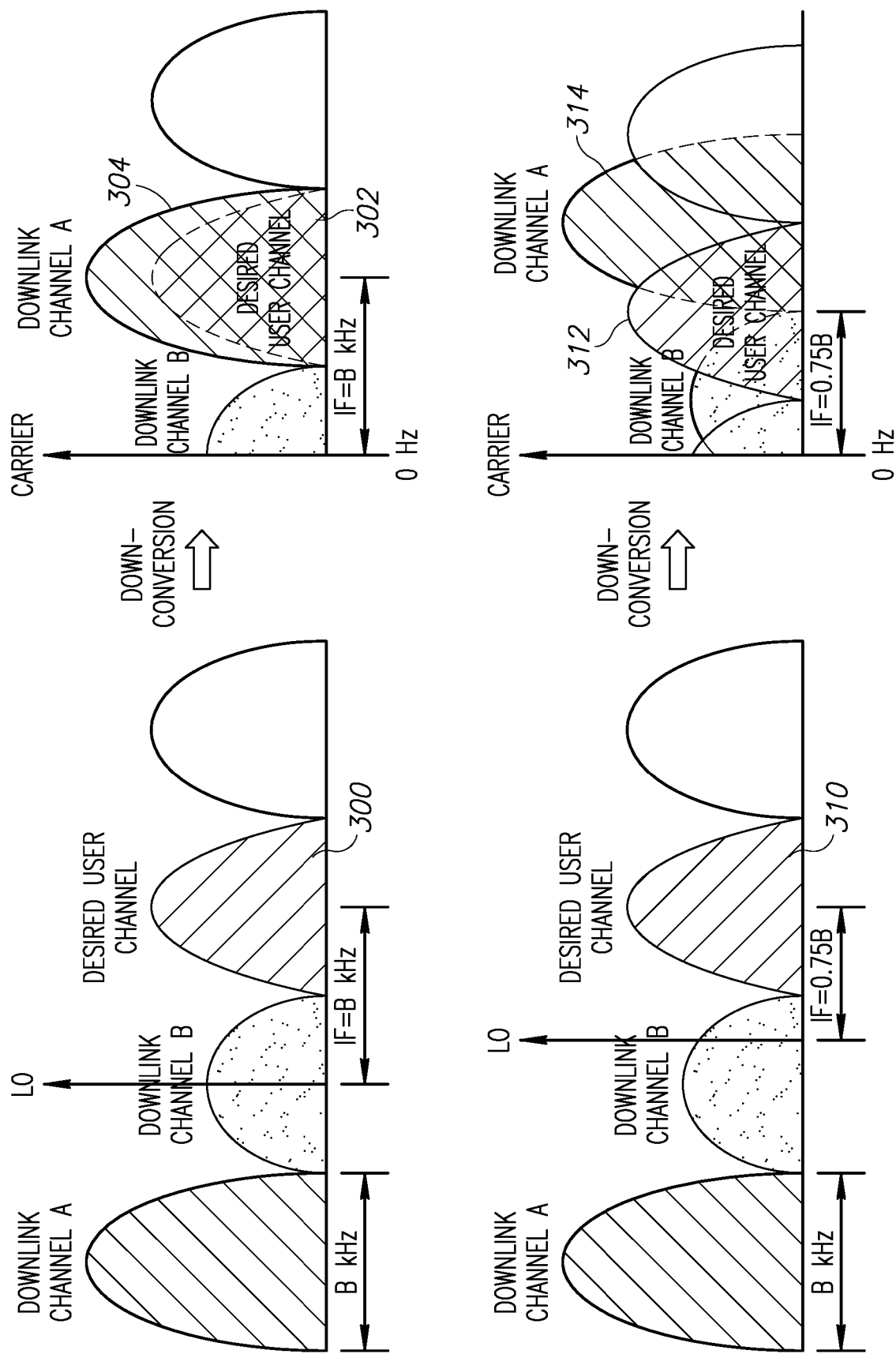
FIG. 10 is a frequency spectrum diagram illustrating how one or two downlink channels can act as image interference.

The value of IF determines whether more than one downlink channel can act as image interference. See FIG. 10 for an example diagram illustrating how one or two downlink channels can act as image interference sources. Thus, with appropriate USI/LSI selection, it can be ensured that the image interference is only caused by the downlink channel(s) operated by the same MNO. This provides a substantial advantage for estimating the image interference.

Additionally, under such assumption, a base station may allocate channels to users such that image interference scenarios are avoided. This can be accomplished by spacing the allocated channels apart such that the image interferer for each allocated channel is not allocated to any other active user. This strategy can be maintained up until the subset of channels satisfying this requirement are exhausted, at which time channels representing potential image interference for previously allocated channels must also be allocated. When the system is operating under such conditions, the base station may still apply a strategy that minimizes the potential impact of image interferers, by allocating channels that can potentially interfere with those users that are already experiencing strong reception conditions and can more easily tolerate image interference.

In one embodiment, the SQRD receiver configuration is preferably used in the presence of relatively low image interference. After switching to the SQRD configuration, the level of image interference is monitored and any increase in image interference that warrants switching back to the DQRD configuration is acted upon.

Typically, mobile phone networks operate well below their peak capacity most of the time and many downlink channels may be unused at a particular time. For example, in GSM systems, one channel is an allocated user time slot on a 200 kHz channel and not the entire 200 kHz frequency channel. When the downlink channels acting as image interference (i.e. $D_{im}$) for a mobile station (MS) are not used by nearby base stations, very low image interference is experienced by the MS. Note that even if the BS is transmitting a predetermined modulation sequence (i.e. a dummy burst) on the unused channel, it can be subtracted during baseband processing and will not cause substantial interference.

The effect of the $D_{im}$ as image interference at a particular time depends on: (1) whether $D_{im}$ is use by any nearby base stations; (2) the strength of the $D_{im}$; and (3) the distance of the $D_{im}$ transmitting base station from the mobile receiver. All this information is available to the MNO either directly or indirectly. Current base station networks track the strength, frequency and time slots of downlink channels in use and this information is readily available to the MNO. Mobile station (MS) position and hence the distance from the $D_{im}$ transmitting base station can be estimated through base station triangulations at the receiver and that information can be conveyed to the base station.

Normally the base station ($BS_{srv}$) that serves the mobile station (MS) is nearest to the MS and the signal transmitted by the serving base station is much stronger than signals from the other base stations. In one example detection scheme, it is assumed that if the serving base station is not using the $D_{im}$, then the image interference should be very low, and the network instructs the MS to attempt the SQRD receiver configuration. If the current signal strength at the MS receiver is higher than the sensitivity level, the MS switches to SQRD configuration and checks the BER performance. Note that alternatively or in addition, EVM or SNR performance can also be used. Also, in GSM systems, the 26-bit midamble can aid in quicker performance evaluation. If the BER or other metric is acceptable, SQRD configuration is maintained. When the serving base station needs to use the downlink channel that may act as image interference, it informs the MS to switch back to DQRD operation mode.

If after switching to the SQRD configuration, BER performance drops below an acceptable level, the MS immediately switches back to DQRD configuration and informs the base station that it cannot operate in SQRD mode. After receiving an 'unable-to-switch-to-SQRD' message, the network waits a certain period before issuing another 'attempt SQRD operation' directive again.

In another detection technique, if the $D_{im}$ is allocated to serving base station $BS_{srv}$ then the detection scheme described supra is likely to be sufficient. If $D_{im}$ is allocated to any other nearby base station $BS_{Dim}$, however, and if that base station is using $D_{im}$, it can cause significant interference, particularly when the MS is near cell boundaries. The detection scheme above is operative in such cases, but it may cause significant 'packet drops' or become ineffective near cell boundaries. This is because at the cell boundaries, the signal level of the desired signal is low, so even without the effect of $D_{im}$, the increased noise in SQRD operation may not be acceptable. In such cases, an approximate location of the MS receiver and its reception conditions need to be established in order to estimate the effect of the $D_{im}$ as interference on the MS.

It is noted that data from the base stations is normally available to the MNO. Once the approximate position of the MS is estimated, the network checks if any nearby BS is using the $D_{im}$. If the $D_{im}$ is not in use, the network issues an 'attempt SQRD operation' directive. If $D_{im}$ is in use by base station $BS_{Dim}$, the effect on $D_{im}$ on the MS is estimated based on the transmitted strength of $D_{im}$ and the distance between the MS and $BS_{Dim}$. If the estimated effect is low, the network issues the 'attempt SQRD operation' directive.

In an alternative detection scheme, when the MS sends back an 'unable-to-switch-to-SQRD' message to the serving base-station, the base-station can increase the transmit power of the desired user channel, if other potentially limiting factors permit that. This process is better facilitated if the MS can report SNR degradation due to DQRD-to-SQRD switching. Increasing the channel power, however, may increase the interference to other channels. One alternative is to give preference to the MSs with low batteries, where the power reduction gained through the use of the SQRD technique is more critically needed.

The detection schemes described supra only consider image interference while estimating the effect of switching receiver operation to SQRD mode. If a strong downlink channel is adjacent to the image channel, switching to SQRD can significantly increase noise, due to reciprocal mixing. Since in most cases the network also knows the strength of the channel adjacent to the image channels, that information can be used to decide whether to issue an 'attempt SQRD operation' (or switch-to-DQRD') directive to the MS. Alternatively, that information can be passed to the MS which utilizes the information to decide whether to operate in SQRD or DQRD configuration.

In many cases, both the USI and LSI are affected by the downlink channels owned by the same MNO. This gives the DDQD-LIF receiver one additional degree of freedom: selection of upper/lower injection. In such cases, the image interference in both USI and LSI is estimated based on the information of the respective downlink channels, and the injection method causing the least image interference is selected. The appropriate selection of USI/LSI not only increases the probability of applying the SQRD configuration, but it also improves DQRD performance by selecting the image with lesser strength. This network assisted USI/LSI selection can be applied in conjunction with the detection schemes described supra.

Modern GSM standards allow for slow frequency hopping in case the interference is high. This situation is more complicated because: (1) if the MS is using frequency hopping, $D_{im}$ itself is variable, i.e. the frequency and time slot of the downlink channels that act as image interference can vary with each hop; and (2) if $D_{im}$ is on the hop sequence of any other MS, its strength will vary with each hop of other MSs. Both the conditions can occur simultaneously. In that case, conditions that determine whether SQRD should be used, vary with each time slot. The network, however, has the complete information of all the frequency hops and accordingly can direct the MS to turn SQRD operation on or off only during the time slots $D_{im}$ is not in use or likely to cause low interference, i.e. for each time-slot individually. If the SQRD facilitation is incorporated in the frequency allocation and frequency hopping sequence in base station algorithms, the number of time slots that the SQRD operation can be used can be maximized to optimize the overall energy-savings benefit.

Autonomous Detection in Handsets

Although network assisted detection provides a solution without any additional hardware, it requires cooperation amongst the network provider, the handset software provider and the wireless transceiver chipset provider. Since autonomous detection can provide a self-contained power efficient solution, it is commercially more attractive and practical for transceiver chipset providers. Moreover, the network assisted approach is effective mostly for cellular applications operating in licensed bands, whereas a device with autonomous detection operating in accordance with the present invention may be used in other multi-user environments where such coordination may not be feasible or cannot be implemented cost-effectively.

The image interference detection task for a SQRD receiver can be divided into two tasks: (1) while the receiver is in DQRD configuration, detect a low image interference scenario suitable for SQRD configuration; and (2) while the receiver is in SQRD configuration, monitor and detect any increase in image interference that necessitates switching back to the DQRD configuration.

Estimation of Image Interference in DQRD Based on Spectrum Energy

Assuming lower side injection, the I and Q channels of the desired signal (i.e. $I_d$, $Q_d$) in the DQRD configuration are obtained by $I_d=II-QQ$ and $Q_d=IQ+QI$. See FIG. 11, which is a high-level block diagram illustrating a circuit for obtaining both the desired channel and its image simultaneously. At the same time, the $I_i$ and $Q_i$ channels of the image signal can be obtained using $I_i=II+QQ$ and $Q_i=IQ-QI$. If upper side injection is used, the equations of the image and the desired signal are interchanged. Note that in DQRD operation, the image signal gets an equal amount of 'signal rejection' as the signal gets 'image rejection'. Hence, the image is well separated from the desired signal in the baseband.

Figure 12:
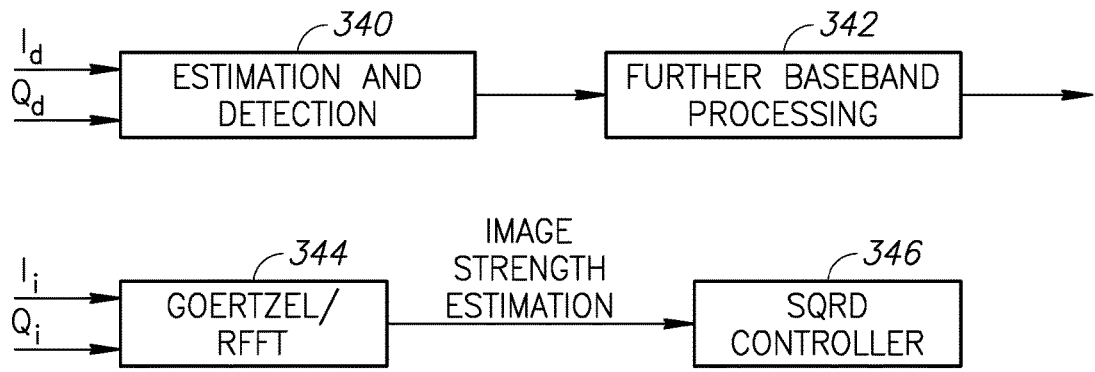
FIG. 12 is a high-level block diagram illustrating to the use of a Goertzel/RFFT estimator for the level of the image signal.

Note that the additional adder and subtractor required for obtaining image channels are normally present in DDQD receivers for calibration purposes. When they are used during normal operation, the image channels are directly available and energy contained in the image channel frequency can be estimated using digital signal processing. Since we do not wish to recover the information encoded in the image channels, no further baseband processing (i.e. estimation and detection, Viterbi decoding, etc.) of the image channels is required apart from the energy estimation, as shown in FIG. 12.

Figure 13:
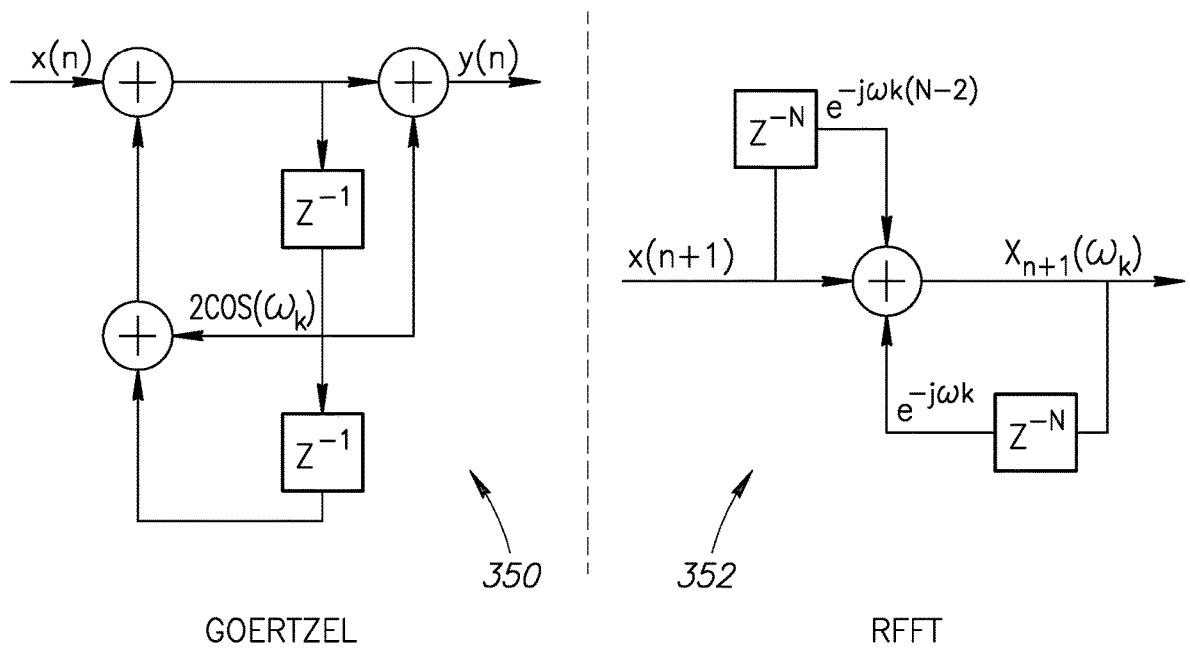
FIG. 13 is a high-level block diagram illustrating example Goertzel and RFFT blocks.

In this case, the full spectrum analysis by FFT is unnecessary since energy estimation of only a small specific part of the spectrum (i.e. the image channel) is required. In one example embodiment, the well-known Goertzel algorithm or Running FFT (RFFT) is used for this task, which provides a much more efficient solution (in both hardware and software). FIG. 13 illustrates an example schematic of the hardware implementation of these algorithms, where N denotes an N point DFT and k is the frequency index. One skilled in the art will notice that compared to other baseband operations, the overhead of a few Goertzel/RFFT blocks is likely to be almost insignificant.

In the event of sufficiently low energy estimation of the image channel, the receiver switches to SQRD configuration and operation mode. Note that the image strength estimation is not required for normal receiver operation. It is only required to check whether an opportunity exists to switch to SQRD configuration. In one embodiment, it is sufficient to check the image interference strength periodically, i.e. at regular intervals, and avoid continuous use of the estimation unit (unless frequency hopping is used).

In an alternative embodiment, the radio receiver utilizes adaptive ADCs in the I and Q branches. The resolution of the ADCs applied in the I and Q branches are adapted to correspond to the level of detected image interference. The variable resolution and/or clock rate of the adaptive ADCs are adjusted in accordance with the varying reception conditions. There is a tradeoff, however, between the conversion performance of the ADCs and their power consumption. Note that adaptive/reconfigurable ADCs are known in the art, e.g., see U.S. Pat. No. 7,002,501 to Gulati et al., incorporated herein by reference in its entirety.

Estimation for USI/LSI Selection

Figure 11:
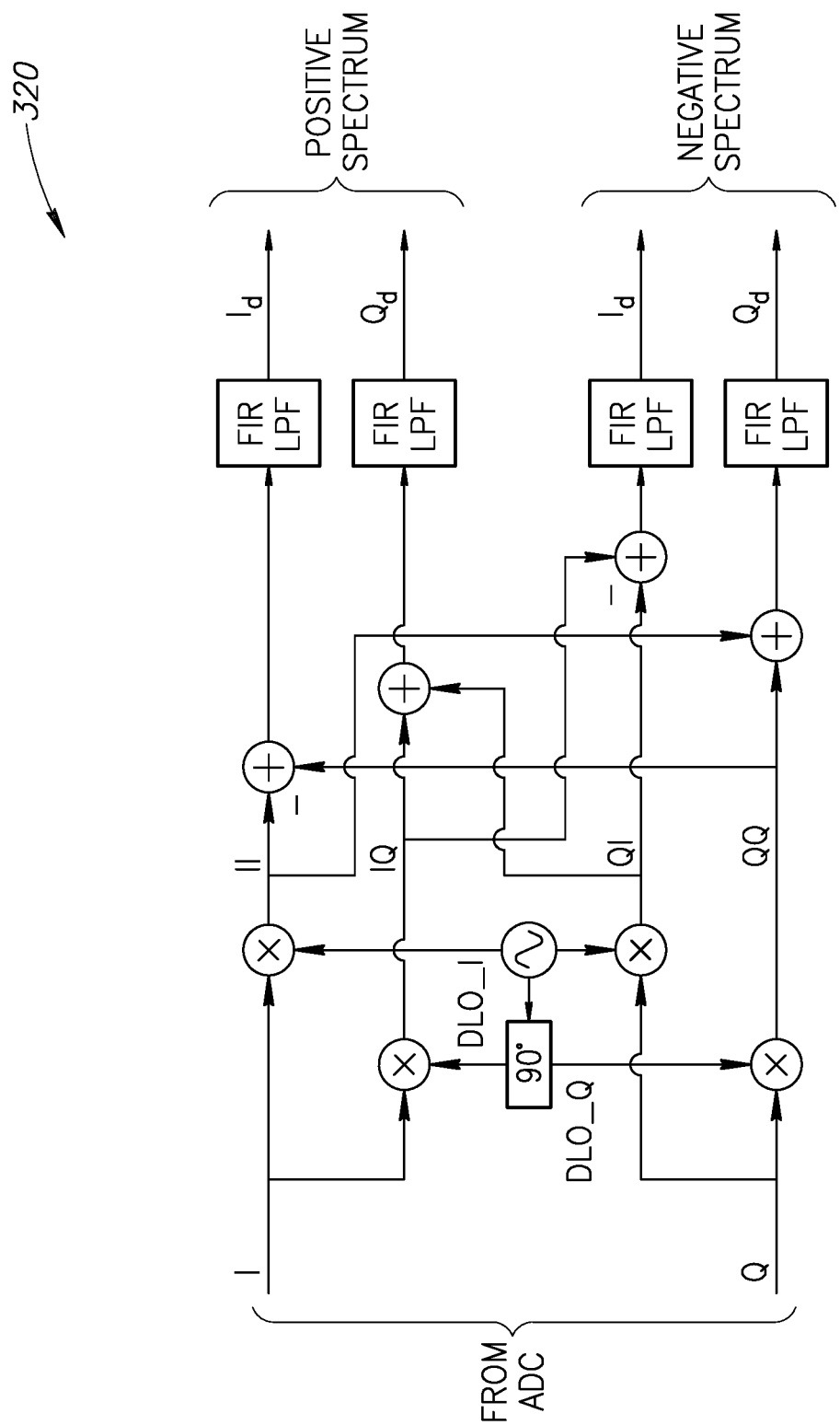
FIG. 11 is a high-level block diagram illustrating a circuit for obtaining both the desired channel and its image simultaneously.

When an additional adder and subtractor in the DQRD configuration are used, as shown in FIG. 11, both the positive and negative spectrums are available separately in the DQRD. As discussed supra, the DDQD-LIF receiver provides the flexibility of selecting USI or LSI depending upon whether upper or lower side injection is used. The USI and LSI are located at 2•IF above and below the desired channel respectively. When lower side injection is used, LSI is down converted to negative IF frequency and USI is downconverted to positive 3•IF frequency. Similarly, when upper side injection is used, USI is downconverted to positive IF frequency and LSI is downconverted to the negative 3•IF frequency. If the bandwidth of the ADC is increased to 3•IF+½B, where B represents the channel bandwidth, the energy of both USI and LSI can be estimated. If either of them are sufficiently low to allow for SQRD operation, the corresponding frequency conversion scheme (upper-side or lower-side) is selected. This technique almost doubles the likelihood of using the SQRD configuration.

Additional ADC bandwidth can be achieved by dynamically increasing the sampling frequency of the sigma-delta ADC when required. Two factors alleviate the additional power consumption due to the increased bandwidth requirement for the ADC: (1) it is sufficient to estimate USI/LSI strength periodically, where the ADC bandwidth is only increased when sensing energy estimation at 3•IF spectrum is warranted; and (2) strong image signals at 3•IF can be sensed even without increasing sigma-delta ADC sampling frequency, thereby allowing for energy consumption savings in the receiver.

Estimation in ZIF for SQRD-LIF

Figure 14:
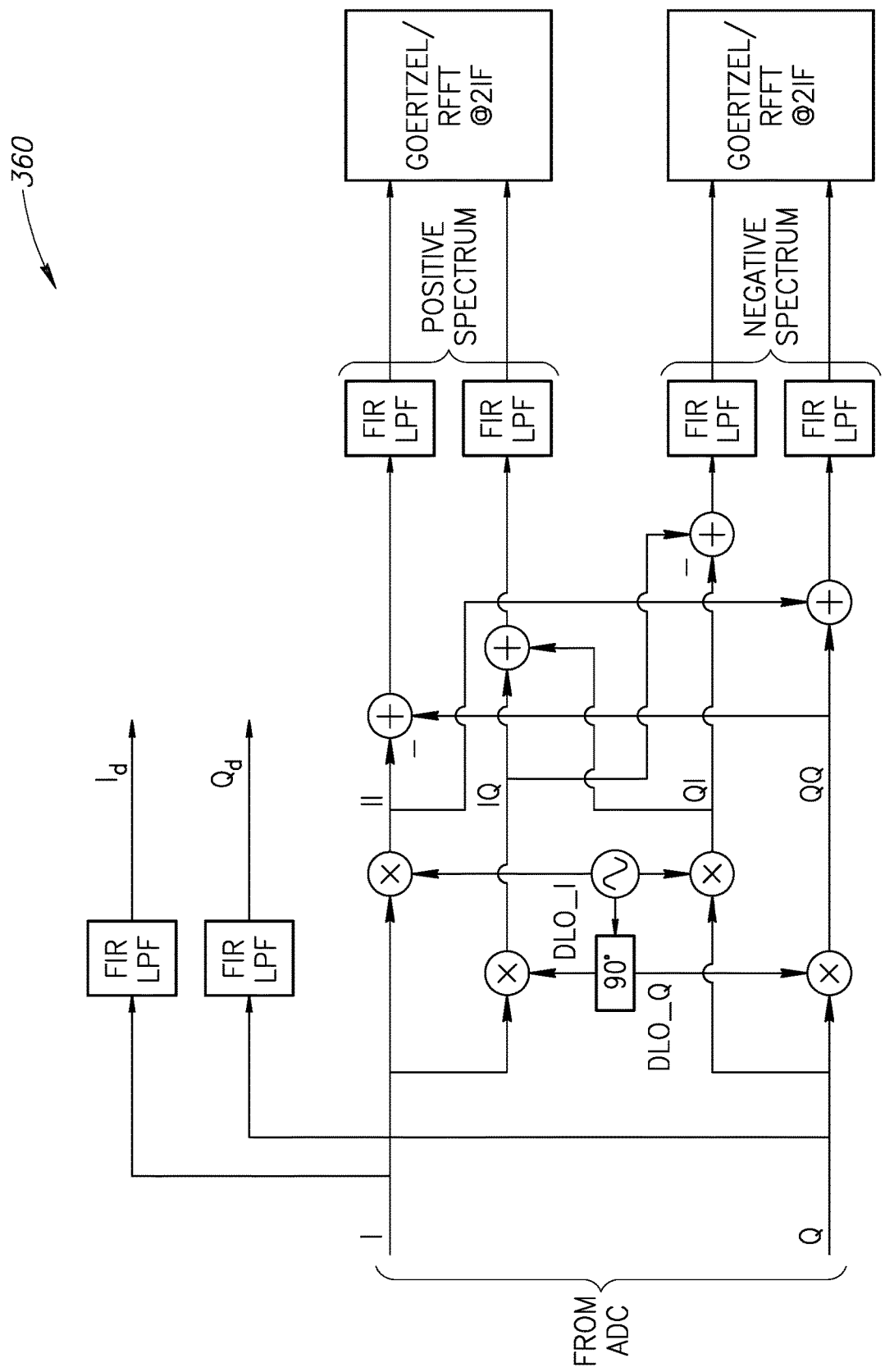
FIG. 14 is a high-level block diagram illustrating an example circuit for estimation of USI and LSI in a ZIF receiver.

As mentioned supra, the DDQD-LIF receiver can also be configured as ZIF with simple digital reconfiguration. When the receiver is operating in ZIF mode, the USI and LSI of LIF mode will be downconverted to positive and negative 2•IF frequency, respectively. The USI and LSI energy is detected using Goertzel/RFFT blocks as shown in FIG. 14. If either LSI or USI is detected as 'unused' with very low signal strength, the receiver switches to SQRD-LIF mode using the USI/LSI frequency conversion method that corresponds to the unused image channel.

Estimation of Image Interference Based on Comparison of SQRD and DQRD

Figure 15:
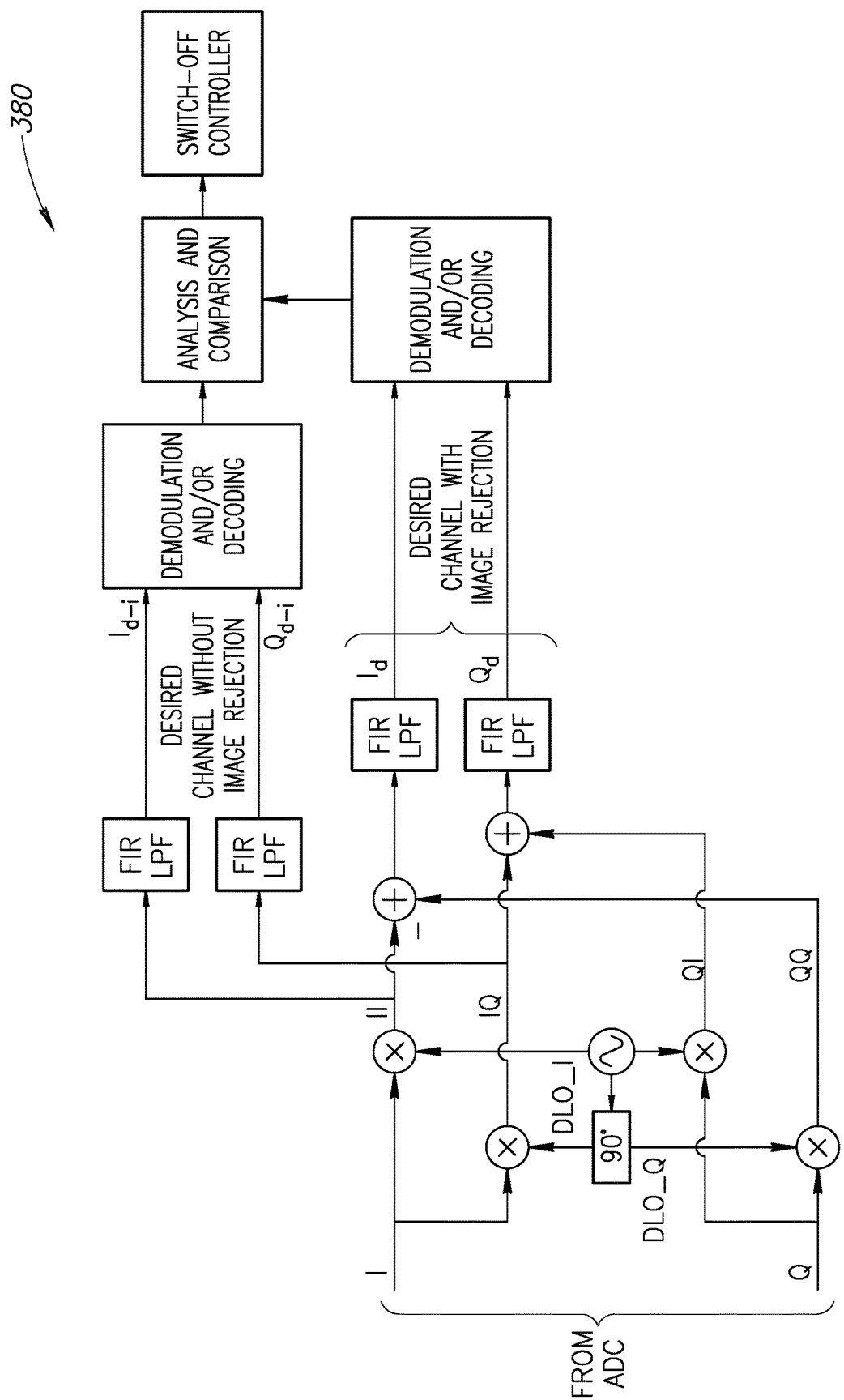
FIG. 15 is a high-level block diagram illustrating a comparison of SQRD and DQRD outputs.

When the receiver is operating in DQRD configuration with image rejection, the SQRD signal without image rejection is also available, as shown in FIG. 15. By comparing the output of both configurations, it can be determined whether image rejection is required or not. In the beginning of the data frame/time slot the output of each configuration is compared and if the outputs of both of them are sufficiently similar (when compared to a predefined threshold), it is determined that the image rejection provided by the DQRD operation is not required and branch-Q is switched off (i.e. SQRD configuration turned on) for the remainder of the frame/time slot.

Estimation of Image Interference in SQRD

In SQRD configuration, the desired signal and the image are superimposed after the first down conversion and it is not possible to separate them. When image interference increases, the decreased SNR causes an increase in bit error rate which can be detected by the preamble symbols (or midamble symbols in a GSM slot). When a sudden increase in BER is detected, which exceeds a predetermined threshold, the MS switches back to DQRD operation.

The IF frequency in SQRD mode is selected such that any other allocated channels can act as image interference to only part of the desired channel spectrum after down conversion. This simplifies the distinction between the desired signal and the image interference since variation in strength in the desired signal versus the image interference channels would affect different portions of the spectrum differently. This difference is exploited by the present invention to generate the differential between the variation in the desired signal strength versus fluctuations in image interference strength.

There are, however, two issues with the above approach. First, the SNR can decrease due to many time-varying factors such as fading, etc. Hence, this detection method can cause false alarms and the MS will unnecessarily switch back to DQRD operation. Second, when strong image interference suddenly appears, it takes a finite time to detect any resultant error and switch back to DQRD operation. Meanwhile, the data received during the detection and transition period will be lost due to the strong image interference. Depending on the wireless standard, this data loss may be unacceptable. Thus, the applicability of this detection scheme depends on the wireless standard and the nature/source of the image interference. Regardless of the issues above, this detection technique based on SNR is useful and adequate for at least some wireless standards. Moreover, hysteresis (as well as averaging/filtering) may be employed in the threshold operations that trigger the transitions back and forth between the two modes of operation, thereby reducing excessive and harmful transitions between the two that may occur in dynamic environments with relatively fast variations (e.g., fast fading and intermittent image interference).

Figure 16:
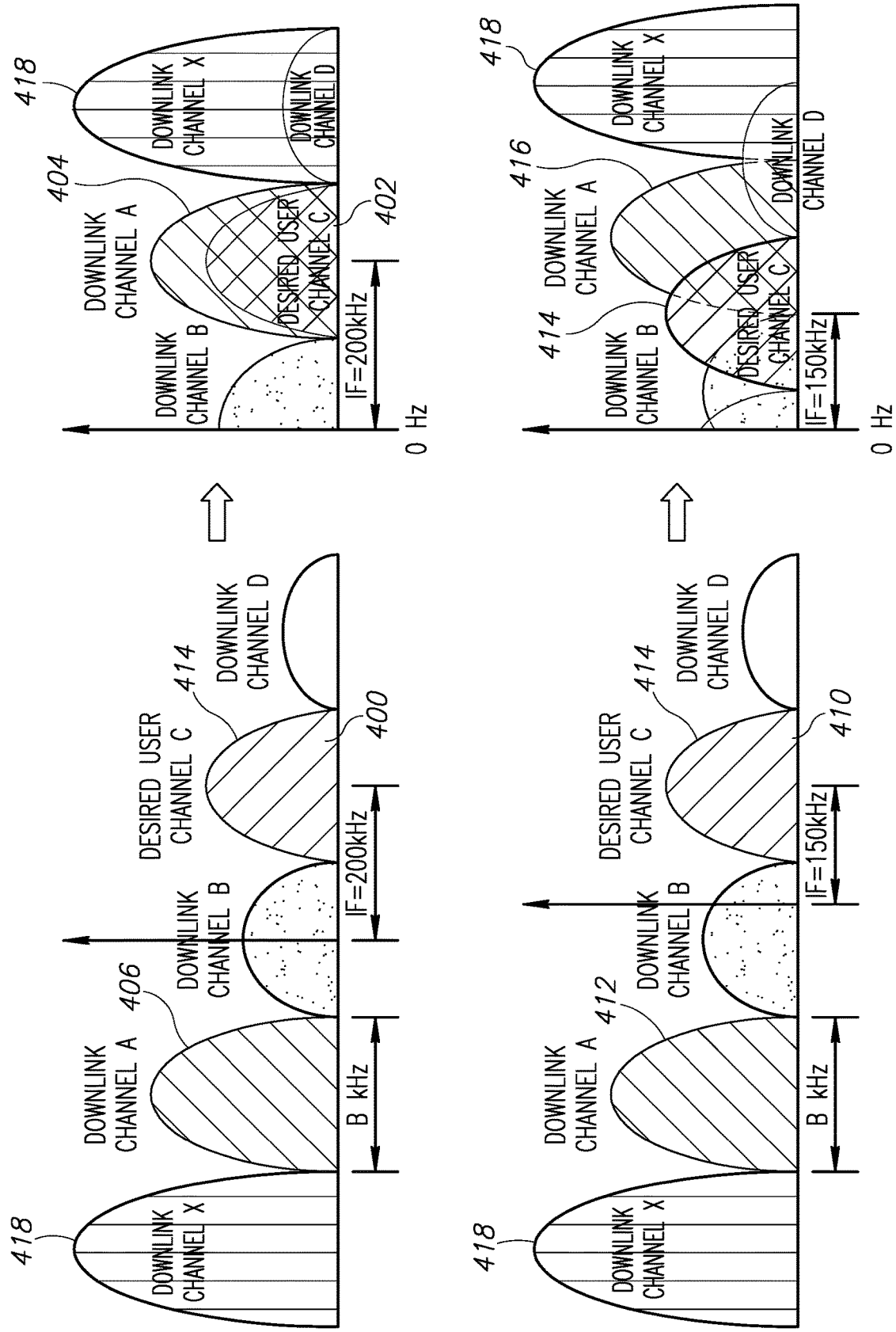
FIG. 16 is a frequency spectrum diagram illustrating multiple down-converted channels as image interference in an example GSM network.

In a licensed wireless standard such as GSM, the image interference is caused by other GSM downlink channels. This information about the nature of the interference can be utilized. For wireless systems like GSM which have a fixed bandwidth of user channels, the present invention provides a detection technique that alleviates the problem of false alarms. The spectral locations of GSM downlink channels are fixed. FIG. 16 illustrates the frequency bins for GSM downlink channels, where channel C is the desired channel 400. When an IF of 200 kHz (i.e. the channel bandwidth) is selected, downlink channel A falls on Channel C after the downconversion and becomes image interference. If channel A is found to be 'unused', in the DQRD configuration, the MS can attempt SQRD configuration. When both downlink channels A and B are detected unused in DQRD configuration, the IF frequency is set to 150 kHz (i.e. 0.75×BW, where BW represents the channel bandwidth) instead of 200 kHz. Note that an added advantage of such an IF selection is that it significantly reduces any effect of a strong interfering channel X (418) on desired channel C (414).

Figure 17:
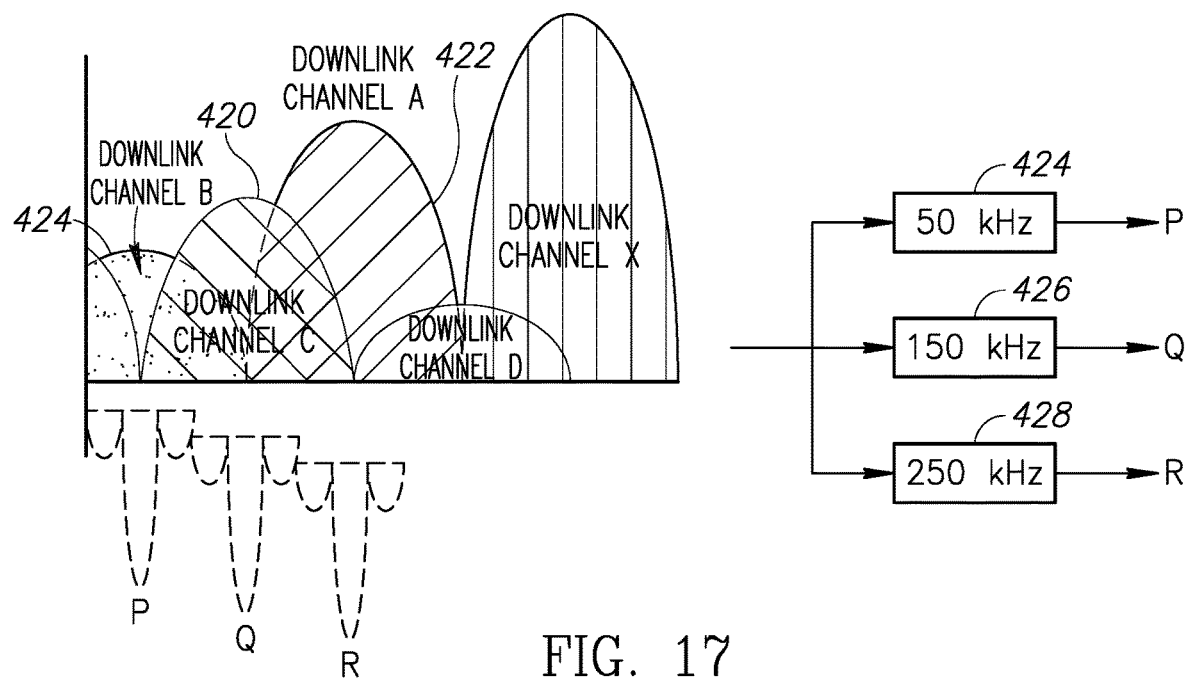
FIG. 17 is a diagram illustrating an example multiple estimator technique for image level estimation in SQRD radio operating mode.

A diagram illustrating an example multiple-interferer estimator technique for image measurement in SQRD radio operating mode is shown in FIG. 17, where both interfering channels A and B partially overlap desired channel C (420). Three Goertzel/RFFT blocks 424, 426, 428 are used to estimate the energy at approximately 50 kHz, 150 kHz and 250 kHz, respectively.

When a downlink channel is used, it occupies the full 200 kHz channel bandwidth. Over the channel bandwidth, the spectral distribution for the desired signal is predictable and is usually relatively flat. When a nearby base station starts using channel A, the output of estimator 428 will be considerably higher than the output of estimator 424 and 426. Any variation in the signal strength of channels A, B, or C will most strongly affect the output of the corresponding estimator block 428, 424, or 426, denoted R, P and Q, respectively. By monitoring and comparing the R, P and Q estimation results, the MS can more accurately estimate the effect of the image interference in the presence of fading in the desired signal.

Figure 18:
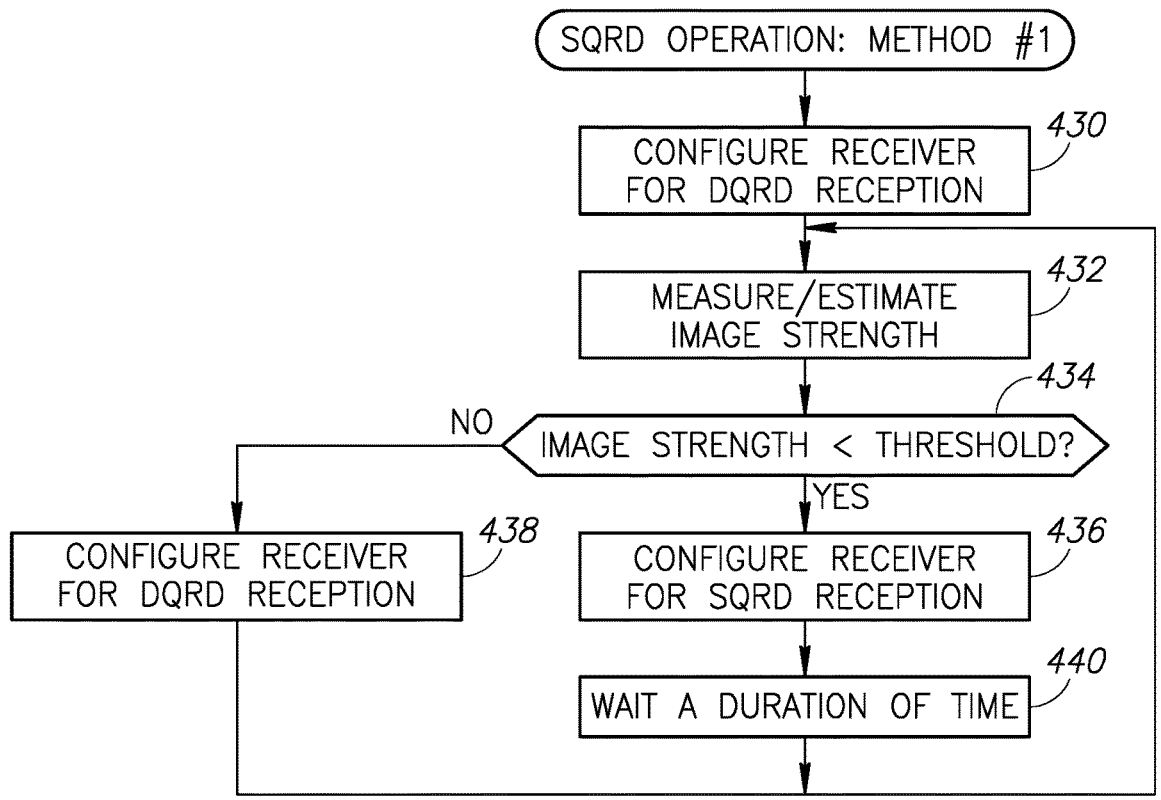
FIG. 18 is a flow diagram illustrating a first example method of SQRD operation in a radio receiver.

A flow diagram illustrating a first example method of the SQRD operation in a radio receiver is shown in FIG. 18. The receiver is first configured for DQRD reception operation (step 430). The strength of the image interferer is then measured or estimated using the techniques described supra (step 432). If the relative image interference strength is less than a threshold (predetermined, static or dynamic) (step 434), the receiver is configured for SQRD reception if not already configured (step 436). Otherwise, the receiver is configured for DQRD reception if not already configured (step 438). The system waits a duration of time (step 440) and the image interference strength is measured again (step 432) and the method continues accordingly. Note that the receiver may or may not be configured initially for DQRD reception as in step 430 depending on the implementation.

Figure 19:
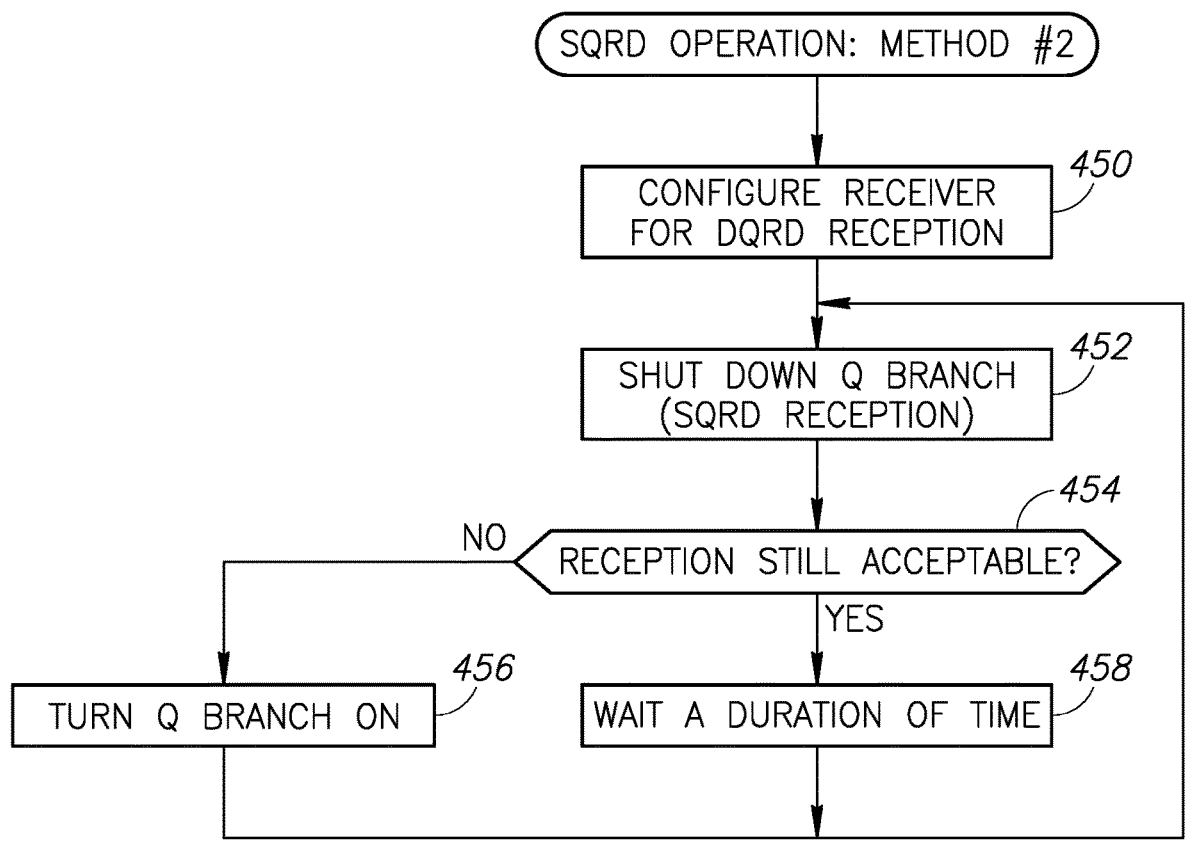
FIG. 19 is a flow diagram illustrating a second example method of SQRD operation in a radio receiver.

A flow diagram illustrating a second example method of SQRD operation in a radio receiver is shown in FIG. 19. In this method, the image interference level is not measured. Instead, the receiver is initially configured for DQRD reception (step 450). The Q-branch is then shut down, if not already turned off (i.e. the receiver is placed in SQRD operation mode) (step 452). If reception is still acceptable (i.e. BER is at an acceptable level or above) (step 454), the system waits a duration of time (step 458) and the method continues with step 452. Otherwise, the I or Q-branch (depending on which is selected) is turned back on (i.e. the receiver is placed in DQRD operation mode) (step 456).

Note that in one embodiment, an additional step may be inserted between steps 450 and 452 wherein the quality of reception is determined (possibly using the same criteria/mechanism assumed to be available in step 454), and if it is found to be marginal, then step 452 (shutting off the Q branch) is not executed.

Portability of Low Image Interference

The probability of having very low image interference depends on multiple factors. One factor is whether the frequency band is licensed or unlicensed. With licensed bands, such as mobile phone bands, the probability can be estimated from the reported spectrum utilization factor. For unlicensed bands, it is difficult to estimate this because (1) it may be difficult to obtain such statistical data; and (2) typically, unlicensed band standards use spectrum sensing and collision detection, which makes frequency usage unpredictable.

A second factor is whether spread spectrum technology is used. The probability of using SQRD techniques is lower if spread spectrum technologies are used.

For licensed mobile band operators, the ratio in spectrum utilization factor during peak usage periods (i.e. during morning and evenings) and low usage periods (i.e. nights) is more than 50%, which means that during light usage periods more than 50% of frequency channels may be unused. Using an intelligent frequency allocation algorithm, which eliminates or minimizes the possibility of image interference, most of the MS units in the network could then use the SQRD configuration.

It is noted that typically the battery life (i.e. recharge cycle) is significantly affected by the power consumption in standby mode, wherein the receiver wakes-up, listens for the message from the transmitter, (i.e. generally on a beacon channel) and goes back to sleep. Such operation requires only low bandwidth channel reception, and it is acceptable to miss data occasionally. This presents an ideal opportunity to configure a variable bandwidth zero-IF system in low bandwidth low-IF SQRD reception to listen during standby mode.

Moreover, several techniques can be used by the handset to increase the probability of using SQRD mode. For instance, LTE receiver chains are capable of receiving a channel up to 20 MHz in bandwidth. Most of the time, however, LTE receivers use only a 1.25 MHz channel (such as during voice calls and standby operations). Such receivers can be configured to receive in SQRD mode with an IF of either 625 kHz, 1.875 MHz or 3.125 MHz. With USI and LSI selection, the receiver can operate in SQRD mode if any of the six channels around the desired channel have no signal. Moreover, one unused channel can be selected as an image band in multiple receivers. Consequently, for every unused 1.25 MHz channel in the system, there are potentially six receivers that can operate in SQRD mode.

Mobile Device Incorporating the Present Invention

Figure 20:
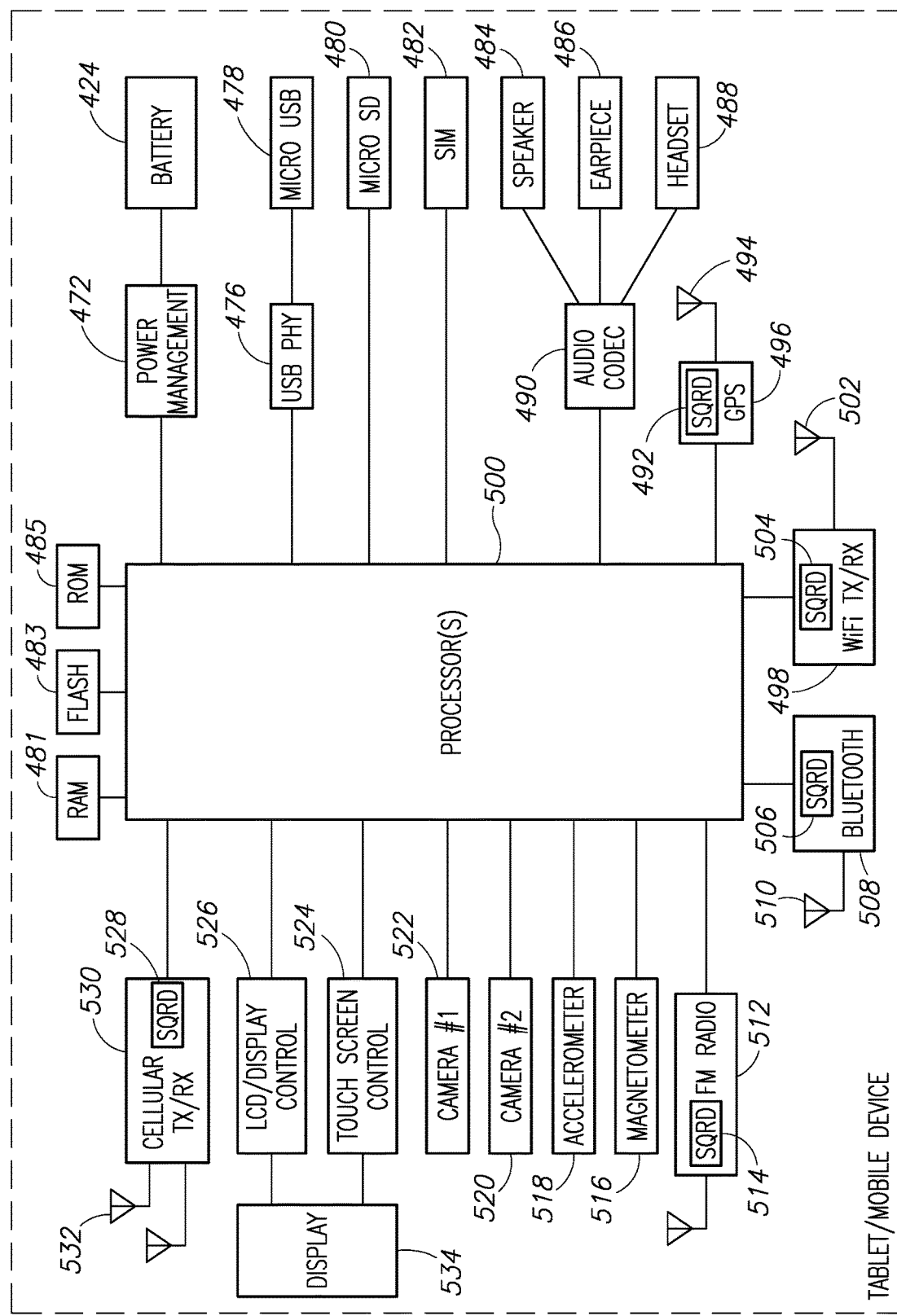
FIG. 20 is a block diagram illustrating an example mobile device incorporating the present invention.

A block diagram illustrating an example tablet/mobile device is shown in FIG. 20. The mobile device may incorporate any or all of the features of the present invention described in detail supra. The mobile device is typically a two-way communication device having voice and/or data communication capabilities. In addition, the device optionally has the capability to communicate with other computer systems via the Internet. Note that the mobile device may comprise any suitable wired or wireless device, such as multimedia player, mobile communication device, digital still and video camera, cellular phone, smartphone, PDA, PNA, Bluetooth device, or tablet device. For illustration purposes only, the device is shown as a smartphone or superphone. Note that this example is not intended to limit the scope of applications of the invention. It is further appreciated that the mobile device shown is intentionally simplified to illustrate only certain components, as the mobile device may comprise other components and subsystems beyond those shown.

The mobile device, generally referenced 470, comprises one or more processors 500, which may comprise a baseband processor, CPU, microprocessor, DSP, etc., optionally having both analog and digital portions. The mobile device may comprise a plurality of cellular radios 530 and associated antennas 532. Radios for the basic cellular link and any number of other wireless standards and Radio Access Technologies (RATs) may be included. Examples include, but are not limited to, Long Term Evolution (LTE), Third Generation (3G) Code Division Multiple Access (CDMA), Personal Communication Services (PCS), Global System for Mobile Communication (GSM)/GPRS/EDGE 3G; 4G; 5G; WCDMA; WiMAX; Bluetooth; WLAN; near field communications (NFC); UWB; GPS receiver for receiving GPS radio signals transmitted from one or more orbiting GPS satellites, FM transceiver provides the user the ability to listen to FM broadcasts as well as the ability to transmit audio over an unused FM station at low power, such as for playback over a car or home stereo system having an FM receiver, digital broadcast television, etc.

The mobile device may also comprise internal volatile memory storage 481 (e.g., RAM), non-volatile storage 485 (e.g., ROM) and flash memory 483. ROM storage 485 also stores applications executable by processor(s) 500 including the related data files used by those applications to allow device 470 to perform its intended functions. Several optional user-interface devices include trackball/thumbwheel, which may comprise a depressible thumbwheel/trackball that is used for navigation, selection of menu choices and confirmation of action, keypad/keyboard such as arranged in QWERTY fashion for entering alphanumeric data and a numeric keypad for entering dialing digits and for other controls and inputs (the keyboard may also contain symbol, function and command keys such as a phone send/end key, a menu key and an escape key), headset 488, earpiece 486 and/or speaker 484, microphone(s) and associated audio codec 490 or other multimedia codecs, vibrator for alerting a user, one or more cameras and related circuitry 520, 522, display(s) 534 and associated display controller 526 and touchscreen control 524. Serial ports include a micro USB port 478 and related USB PHY 476 and micro SD port 480. Other interface connections may include SPI, SDIO, PCI, USB, etc. for providing a serial link to a user's PC or other device. SIM/RUIM card 482 provides the interface to a user's SIM or RUIM card for storing user data such as address book entries, user identification, etc.

Portable power is provided by the battery 474 coupled to power management circuitry 472. External power is provided via USB power or an AC/DC adapter connected to the power management circuitry that is operative to manage the charging and discharging of the battery. In addition to a battery and AC/DC external power source, additional optional power sources each with its own power limitations, include: a speaker phone, DC/DC power source, and any bus powered power source (e.g., USB device in bus powered mode).

Operating system software executed by the processor 500 is preferably stored in persistent storage (i.e. ROM 485), or flash memory 483, but may be stored in other types of memory devices. In addition, system software, specific device applications, or parts thereof, may be temporarily loaded into volatile storage 481, such as random access memory (RAM). Communications signals received by the mobile device may also be stored in the RAM.

The processor 500, in addition to its operating system functions, enables execution of software applications on the device 470. A predetermined set of applications that control basic device operations, such as data and voice communications, may be installed during manufacture. Additional applications (or apps) may be downloaded from the Internet and installed in memory for execution on the processor. Alternatively, software may be downloaded via any other suitable protocol, such as SDIO, USB, network server, etc.

Other components of the mobile device include an accelerometer 518 for detecting motion and orientation of the device, gyroscope 517 for measuring or maintaining orientation, magnetometer 516 for detecting the earth's magnetic field, FM radio 512 and antenna 513, Bluetooth radio 508 and antenna 510, Wi-Fi radio 498 including antenna 502 and GPS 492 and antenna 494.

In accordance with the present invention, the mobile device 470 may comprise any or all of the features of the present invention described in detail supra, which are generally denoted "SQRD" in FIG. 20. Numerous embodiments of the mobile device 470 may comprise the SQRD capability 528, as described supra, incorporated in the one or more cellular radios 530; as SQRD circuit 514 as described supra incorporated in the FM radio 512; a SQRD circuit 506 as described supra incorporated in the Bluetooth radio 508; a SQRD circuit 504 as described supra incorporated in the Wi-Fi radio 498; and a SQRD circuit 492 as described supra incorporated in the GPS radio 496.

Internet of Things (IoT) Node Incorporating the Present Invention

The Internet of Things (IoT) is defined as the network of physical objects or "things" embedded with electronics, software, sensors and network connectivity, which enable these objects to collect and exchange data. The IoT allows objects to be sensed and controlled remotely across existing network infrastructure, creating opportunities for more direct integration between the physical world and computer-based systems, and resulting in improved efficiency, accuracy and economic benefit. Each 'thing' is uniquely identifiable through its embedded computing system but is able to interoperate within the existing Internet infrastructure. Experts estimate that the IoT will consist of almost 50 billion objects by 2020.

Figure 21:
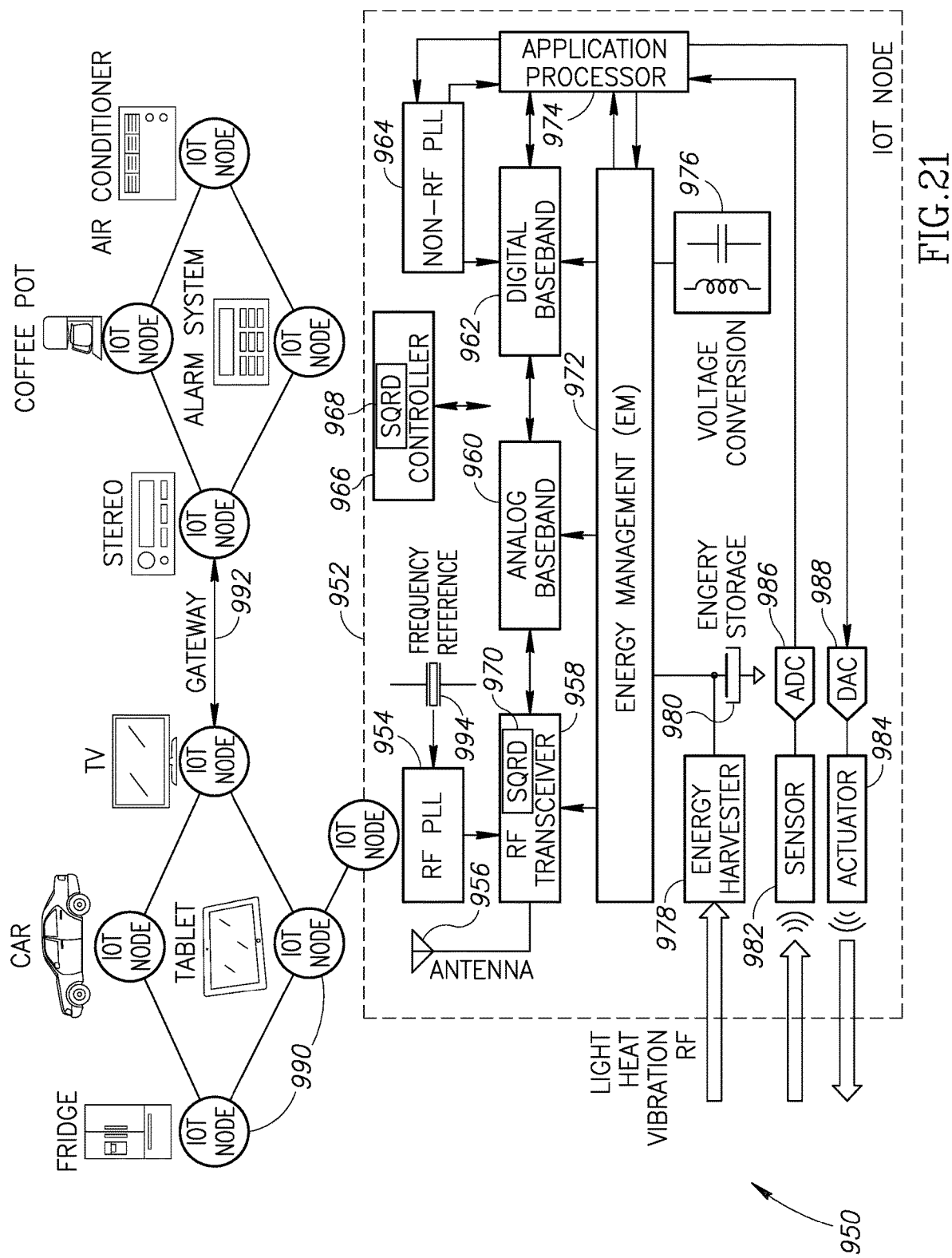
FIG. 21 is a block diagram illustrating an example IoT node incorporating the present invention.

A block diagram illustrating an example IoT node incorporating the SQRD/DQRD switching technique of the present invention is shown in FIG. 21. The example IoT, generally referenced 950, comprises a plurality of nodes 990. The architecture of an example IoT node 952 shown can be fully integrated as a System on Chip (SoC) on a single IC chip in nanoscale CMOS. It contains the radio subsystem to wirelessly communicate with other nodes and gateways 992, application processor to provide a certain amount of local "intelligence", sensors, optional actuators to interface with the environment, and an energy management function which may optionally harvest energy (light, heat, vibration or RF power) from the environment, and/or convert a battery's voltage levels to those required by the functional circuitry. The RF and non-RF frequency synthesizers provide local oscillator and processor clocks, respectively. A frequency reference 994 provides a fixed clock with long-term stability to the frequency synthesizers.

In accordance with the present invention, the IoT node 952 may comprise any or all of the features of the present invention described in detail supra, generally denoted "SQRD" in FIG. 21. In one example embodiment, the IoT device may include only the present invention's feature of image interference detection (e.g., realized through spectral scanning/mapping), which would be useful to report such data to another device where it may be used in order to determine whether SQRD could be used (and whether in USI or LSI). In such an example, the IoT device does not have the DQRD/SQRD switching itself. Numerous embodiments of the IoT node 952 may comprise a SQRD circuit or equivalent software 968 in controller 966; and an SQRD circuit 970 as described supra incorporated in RF transceiver 958.

The RF transceiver 958 interfaces with an antenna 956. The RF signals on the order of 100's of MHz up to several GHz are upconverted and downconverted there to the lower (i.e. baseband) frequencies, which are then processed in the analog baseband circuitry. The conversions from analog to digital (i.e. ADC), and vice versa (i.e. DAC), are also performed there. The digital baseband completes the physical layer of a chosen communication standard. The application processor performs various control and signal processing functions and is responsible for providing a level of "intelligence" to the IoT node.

The RF frequency synthesizer 954 may be realized as an all-digital PLL (ADPLL) and provides a local oscillator signal to the RF transceiver 958. The non-RF frequency synthesizer 964 provides clocks to the digital baseband 962 and application processors 974. The clock frequency is preferably dynamically switchable in response to the changing computational load conditions. The energy management (EM) circuitry 972 provides energy conversion between the energy harvester 978 and/or low-capacity storage battery 980 and all the IoT functional circuits. The EM circuit carries out several functions. First, it boosts the voltage from the energy harvester (harvesting from sources such as light, heat, vibration, and RF emissions) to that required by the nanoscale CMOS circuits, which is in the range of 0.7 to 1.0 V, assuming 40 nm CMOS technology. This is performed by a dedicated DC-DC boost converter 976. Second, it downshifts the energy from a battery, which is on the order of 1.5 to 3.6 V to that required by the nanoscale CMOS circuits. This is performed by a dedicated DC-DC buck converter, which may also be included in 976. Third, both boost and buck converters use energy storage passive devices, i.e. capacitor or inductor for storing electrical and magnetic energy, respectively, in order to change the voltage level with high efficiency. The high conversion efficiency must be maintained across the entire range of the allowed loads. Fourth, the EM unit needs to provide many power supply domains. This is dictated by the different voltage level requirements during voltage scaling. Fifth, the EM supply domains preferably provide individually adjustable voltage levels. The supply voltage level of digital logic circuits widely varies depending on the fast changing real time computational load conditions, while the voltage level of digital RF and analog circuits experience less of such variance, and mainly due to temperature and operating frequency, as well as communication channel conditions. Moreover, the analog circuits have to be properly biased, which normally prevents them from operating at near-threshold conditions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of reducing power consumption in a double quadrature RF downconversion (DQRD) low intermediate frequency (LIF) radio receiver, the method comprising:
   operating said radio receiver in double quadrature RF downconversion (DQRD) mode;
   detecting a level of image interference strength in said radio receiver;
   switching said receiver to single quadrature RF downconversion (SQRD) operation mode when the level of image interference strength falls below a predetermined level as image rejection of said DQRD mode is not required;

wherein at least one of an I branch and Q branch in said radio receiver is powered down during SQRD operation mode; and switching said radio receiver back to DQRD operation mode when the level of image interference strength rises above said predetermined level.

2. The method according to claim 1, wherein at least one of an I branch and Q branch in said radio receiver is switched off during SQRD operation mode, and wherein said at least one of said I branch and said Q branch in said radio receiver is switched on during DQRD operation mode.

3. The method according to claim 1, wherein a single unused communication channel can be used by multiple radio receivers for switching to SQRD operating mode.

4. The method according to claim 1, wherein said radio receiver implementing said method is incorporated in at least one of a mobile device, tablet, IoT device, and computer.

5. The method according to claim 1, wherein I and Q data from a desired transmitted channel continue to be generated and data from neither I nor Q branches is lost.

6. The method according to claim 1, wherein the operation of said radio receiver is dynamically switched between said SQRD and DQRD modes of operation depending upon said level of image interference strength at any given instance in time.

7. A method of reducing power consumption in a double quadrature RF downconversion (DQRD) low intermediate frequency (LIF) radio receiver, the method comprising:

operating said radio receiver in double quadrature RF downconversion (DQRD) mode;

periodically switching said radio receiver to single quadrature RF downconversion (SQRD) operation mode;

detecting whether reception of said radio receiver is acceptable or not;

continuing to operate said radio receiver in SQRD mode if radio reception is acceptable as image rejection of said DQRD mode is not required;

wherein at least one of an I branch and Q branch in said radio receiver is powered down during SQRD operation mode; and switching said radio receiver back to DQRD operation mode if radio reception is not acceptable.

8. The method according to claim 7, wherein at least one of an I branch and Q branch in said radio receiver is switched off during SQRD operation mode, and wherein said at least one of said I branch and said Q branch in said radio receiver is switched on during DQRD operation mode.

9. The method according to claim 7, wherein said radio receiver implementing said method is incorporated in at least one of a mobile device, tablet, IoT device, and computer.

10. The method according to claim 7, wherein I and Q data from a desired transmitted channel continue to be generated and data from neither I nor Q branches is lost.

11. The method according to claim 7, wherein the operation of said radio receiver is dynamically switched between said SQRD and DQRD modes of operation depending upon said level of image interference strength at any given instance in time.

12. A method of reducing power consumption in a double quadrature RF downconversion (DQRD) low intermediate frequency (LIF) radio receiver in a mobile device in communication with a base station, the method comprising:

receiving a first notification from the base station to attempt single quadrature RF downconversion (SQRD) operation mode;

determining current signal strength and checking if it is above a first threshold;

if the current signal strength is above the first threshold and in response to the first notification, switching said receiver to SQRD operation mode as image rejection of said DQRD mode is not required;

wherein at least one of an I branch and Q branch in said radio receiver is powered down during SQRD operation mode; and continuing to operate in SQRD mode if a performance metric is above a second threshold.

13. The method according to claim 12, further comprising:

switching said receiver to DQRD operation mode when the performance metric falls below the second threshold; and notifying the base station that the radio receiver is in DQRD operating mode.

14. The method according to claim 12, further comprising:

receiving a second notification from the base station to stop operating in SQRD mode and to switch to DQRD operation mode; and switching said radio receiver to DQRD operation mode in response to the second notification.

15. The method according to claim 12, wherein at least one of an I branch and a Q branch in said radio receiver is switched off during SQRD operation mode, and wherein said at least one of said I branch and said Q branch in said radio receiver is switched on during DQRD operation mode.

16. The method according to claim 12, wherein I and Q data from a desired transmitted channel continue to be generated and data from neither I nor Q branches is lost.

17. The method according to claim 12, wherein the operation of said radio receiver is dynamically switched between said SQRD and DQRD modes of operation depending upon said level of image interference strength at any given instance in time.

* * * * *